United States Patent
Long et al.

(10) Patent No.: US 9,896,604 B2
(45) Date of Patent: Feb. 20, 2018

(54) METHODS OF POLISHING SAPPHIRE SURFACES

(71) Applicant: Ecolab USA Inc., Naperville, IL (US)

(72) Inventors: Kim Marie Long, Naperville, IL (US); Michael A. Kamrath, Aurora, IL (US); Sean McCue, Chicago, IL (US)

(73) Assignee: ECOLAB USA INC., Naperville, IL (US)

(*) Notice: Subject to any disclaimer, the term of this patent is extended or adjusted under 35 U.S.C. 154(b) by 0 days.

(21) Appl. No.: 14/206,947

(22) Filed: Mar. 12, 2014

(65) Prior Publication Data

US 2014/0263170 A1    Sep. 18, 2014

Related U.S. Application Data

(60) Provisional application No. 61/791,550, filed on Mar. 15, 2013.

(51) Int. Cl.
| | |
|---|---|
| *H01L 21/302* | (2006.01) |
| *H01L 21/461* | (2006.01) |
| *H01L 21/311* | (2006.01) |
| *B44C 1/22* | (2006.01) |
| *C03C 15/00* | (2006.01) |
| *C03C 25/68* | (2006.01) |

(Continued)

(52) U.S. Cl.
CPC ............... *C09G 1/02* (2013.01); *B24B 7/228* (2013.01); *B24B 37/044* (2013.01); *C09G 1/04* (2013.01); *H01L 21/02065* (2013.01); *H01L 21/31051* (2013.01); *H01L 21/31055* (2013.01); *H01L 21/7684* (2013.01); *B81C 1/00611* (2013.01); *B81C 2201/0118* (2013.01)

(58) Field of Classification Search
None
See application file for complete search history.

(56) References Cited

U.S. PATENT DOCUMENTS

| 5,228,886 A | 7/1993 | Zipperian |
| 5,407,526 A * | 4/1995 | Danielson et al. ........... 438/693 |

(Continued)

FOREIGN PATENT DOCUMENTS

| CN | 1519293 A | 8/2004 |
| CN | 101511532 A | 8/2009 |

(Continued)

OTHER PUBLICATIONS

International Search Report and The Written Opinion from corresponding PCT Appln. No. PCT/US2014/024455 dated Jul. 21, 2014 (16 pgs).

(Continued)

*Primary Examiner* — Stephanie Duclair
(74) *Attorney, Agent, or Firm* — Eric D. Babych; Brinks Gilson & Lione

(57) ABSTRACT

Described herein are compositions, kits and methods for polishing sapphire surfaces using compositions having colloidal aluminosilicate particles in an aqueous acidic solution. In some aspects, the methods for polishing a sapphire surface may include abrading a sapphire surface with a rotating polishing pad and a polishing composition. The polishing composition may include an amount of a colloidal aluminosilicate and may have a pH of about 2.0 to about 7.0.

8 Claims, 17 Drawing Sheets

(51) Int. Cl.

| | | |
|---|---|---|
| C09G 1/02 | (2006.01) | |
| H01L 21/3105 | (2006.01) | |
| H01L 21/02 | (2006.01) | |
| H01L 21/768 | (2006.01) | |
| C09G 1/04 | (2006.01) | |
| B24B 37/04 | (2012.01) | |
| B24B 7/22 | (2006.01) | |
| B81C 1/00 | (2006.01) | |

(56) References Cited

U.S. PATENT DOCUMENTS

| | | | |
|---|---|---|---|
| 6,386,950 B1 | 5/2002 | Jacquinot et al. | |
| 6,517,426 B2 | 2/2003 | Lee | |
| 6,719,819 B2 | 4/2004 | Ota et al. | |
| 6,786,945 B2 * | 9/2004 | Machii et al. | 51/307 |
| 6,910,952 B2 | 6/2005 | Suenaga et al. | |
| 7,695,347 B2 * | 4/2010 | Masumura et al. | 451/41 |
| 8,052,788 B2 | 11/2011 | MacDonald | |
| 8,118,898 B2 | 2/2012 | Wakamiya et al. | |
| 8,702,472 B2 | 4/2014 | Morinaga et al. | |
| 8,721,917 B2 | 5/2014 | Cherian et al. | |
| 8,728,341 B2 | 5/2014 | Ryuzaki et al. | |
| 9,074,118 B2 | 7/2015 | Vacassy et al. | |
| 2004/0065022 A1 | 4/2004 | Machii et al. | |
| 2004/0132306 A1 * | 7/2004 | Bellman | C09G 1/02 438/690 |
| 2004/0162012 A1 | 8/2004 | Suenaga et al. | |
| 2005/0014455 A1 | 1/2005 | Masumura et al. | |
| 2005/0050803 A1 | 3/2005 | Amanokura et al. | |
| 2005/0227591 A1 | 10/2005 | Enomoto et al. | |
| 2005/0234136 A1 | 10/2005 | Holland et al. | |
| 2006/0175295 A1 | 8/2006 | Chu et al. | |
| 2006/0196849 A1 * | 9/2006 | Moeggenborg et al. | 216/88 |
| 2007/0116423 A1 | 5/2007 | Leatherdale et al. | |
| 2007/0181850 A1 * | 8/2007 | Kamimura | C09G 1/02 252/79.1 |
| 2008/0057716 A1 * | 3/2008 | Yamashita | 438/693 |
| 2008/0283502 A1 | 11/2008 | Moeggenborg et al. | |
| 2009/0018219 A1 | 1/2009 | MacDonald | |
| 2009/0098807 A1 | 4/2009 | Bakshi et al. | |
| 2009/0104851 A1 * | 4/2009 | Cherian | C09K 3/1463 451/36 |
| 2009/0314744 A1 * | 12/2009 | Vacassy et al. | 216/53 |
| 2011/0223840 A1 | 9/2011 | Morinaga et al. | |
| 2012/0129346 A1 | 5/2012 | Ryuzaki et al. | |
| 2012/0270400 A1 | 10/2012 | Takegoshi et al. | |
| 2013/0037515 A1 | 2/2013 | Hosoi et al. | |
| 2013/0115859 A1 | 5/2013 | Choi et al. | |
| 2013/0130595 A1 | 5/2013 | Yoshida | |
| 2014/0001153 A1 | 1/2014 | Matsuyama et al. | |
| 2014/0057532 A1 | 2/2014 | Long et al. | |
| 2014/0057533 A1 | 2/2014 | Long et al. | |
| 2014/0263170 A1 | 9/2014 | Long et al. | |
| 2014/0335308 A1 | 11/2014 | Tanikella et al. | |

FOREIGN PATENT DOCUMENTS

| | | | |
|---|---|---|---|
| CN | 102343547 A | | 2/2012 |
| CN | 102473622 A | | 5/2012 |
| CN | 102513906 A | | 6/2012 |
| CN | 102775916 A | | 11/2012 |
| EP | 0107354 B1 | * | 3/1988 |
| JP | 2007-531631 A | | 11/2007 |
| JP | 2007-532470 A | | 11/2007 |
| JP | 2008-044078 | | 2/2008 |
| JP | 2008-169102 A | | 7/2008 |
| JP | 2008-531319 A | | 8/2008 |
| JP | 2009/028814 A | | 2/2009 |
| JP | 2009-297818 | | 12/2009 |
| JP | 2009-543375 A | | 12/2009 |
| JP | 2011-162402 | | 8/2011 |
| JP | 2012/503586 A | | 2/2012 |
| TW | I 287484 | | 10/2007 |
| WO | WO 2009/021364 A1 | | 2/2009 |
| WO | WO 2012/005142 A1 | | 1/2012 |
| WO | WO 2012/005142 A1 | | 9/2013 |

OTHER PUBLICATIONS

International Search Report and Written Opinion from corresponding PCT Appln. No. PCT/US2013/056482 dated Nov. 6, 2013 (12 pages).

* cited by examiner

METHODS OF POLISHING SAPPHIRE SURFACES

CROSS-REFERENCE TO RELATED APPLICATIONS

This application claims priority from U.S. Provisional Application No. 61/791,550, filed Mar. 15, 2013, the entire contents of which are hereby incorporated by reference.

FIELD OF THE INVENTION

The present invention relates to compositions, kits and methods for polishing sapphire surfaces using polishing compositions comprising colloidal aluminosilicate particles in an aqueous acidic solution.

BACKGROUND OF THE INVENTION

Sapphire is a generic term for alumina ($Al_2O_3$) single-crystal materials. Sapphire is a particularly useful material for use as windows for infrared and microwave systems, optical transmission windows for ultraviolet to near infrared light, light emitting diodes, ruby lasers, laser diodes, support materials for microelectronic integrated circuit applications and growth of superconducting compounds and gallium nitride, and the like. Sapphire has excellent chemical stability, optical transparency and desirable mechanical properties, such as chip resistance, durability, scratch resistance, radiation resistance, a good match for the coefficient of thermal expansion of gallium arsenide, and flexural strength at elevated temperatures.

Sapphire wafers are commonly cut along a number of crystallographic axes, such as the C-plane (0001 orientation, also called the 0-degree plane or the basal plane), the A-plane (1120 orientation, also referred to as 90 degree sapphire) and the R-plane (1102 orientation, 57.6 degrees from the C-plane). R-plane sapphire, which is particularly suitable for silicon-on-sapphire materials used in semiconductor, microwave and pressure transducer applications, is more resistant to polishing than C-plane sapphire, which is typically used in optical systems, infrared detectors, and growth of gallium nitride for light-emitting diode applications.

The polishing and cutting of sapphire wafers can be an extremely slow and laborious process. Often, aggressive abrasives, such as diamond, must be used to achieve acceptable polishing rates. Such aggressive abrasive materials can impart serious surface damage and contamination to the wafer surface. Typical sapphire polishing involves continuously applying a slurry of abrasive to the surface of the sapphire wafer to be polished, and simultaneously polishing the resulting abrasive-coated surface with a rotating polishing pad, which is moved across the surface of the wafer, and held against the wafer surface by a constant down-force, typically in the range of about 5 to 20 pounds per square inch (psi).

It has been hypothesized that the interaction of sapphire and colloidal silica under the temperature and pressure of polishing pads leads to an energetically favorable chemical reaction for the formation of aluminum silicate dihydrate species (i.e., $Al_2O_3 + 2SiO_2 \rightarrow Al_2Si_2O_7 \cdot 2H_2O$). The hardness of these various hydrates and aluminum species are assumed to be lower than the underlying sapphire, resulting in a slight film, which can be easily removed by colloidal silica slurries without damaging the underlying surfaces. Prior practices have also focused on increasing polishing temperatures to increase the rate of alumina hydrate film formation and thus the removal rate. It has also been shown that increasing salt concentrations in basic colloidal silica slurries have increased removal rates for both c and m plane sapphire. Finally adding aluminum chelating agents, such as EDTA derivatives and ether-alcohol surfactants enhances polishing performance by tying up and lifting off the surface alumina species and suspending the slurry components for a cleaner wafer surface.

None of these developments in sapphire polishing however have completely resolved polishing performance due to the typically slow polishing rates achievable with other abrasive materials. Accordingly, there is an ongoing need for compositions, kits and methods to enhance the efficiency of polishing of sapphire surfaces.

SUMMARY OF INVENTION

The present invention is directed a method of polishing a sapphire surface, comprising abrading a sapphire surface with an aqueous polishing composition, wherein the polishing composition comprises an effective amount of a colloidal aluminosilicate, and the pH of the polishing composition is about 2.0 to about 7.0.

The present invention is directed to a method of polishing a sapphire surface, comprising: abrading a sapphire surface with a rotating polishing pad and a polishing composition, wherein the polishing composition comprises an effective amount of a colloidal aluminosilicate, and wherein the composition has a pH of about 2.0 to about 7.0. In some embodiments, the composition has a pH of about 3.0 to about 6.5. In some embodiments, the colloidal aluminosilicate comprises about 1 wt. % to about 50 wt. % of the polishing composition. In some embodiments, the colloidal aluminosilicate has a mean particle size of about 50 nm to about 150 nm. In some embodiments, the colloidal aluminosilicate has a mean particle size of about 75 nm to about 125 nm. In some embodiments, the ratio of the standard deviation of the particle size of the colloidal aluminosilicate ($\sigma$), to the mean particle size of the colloidal aluminosilicate (r), is less than about 0.3. In some embodiments, the polishing composition has a zeta potential of less than about −20 mV. In some embodiments, the colloidal aluminosilicate comprises about 0.01 wt % to about 2.0 wt % aluminum (Al) based on silica.

In some embodiments, the polishing composition further comprises an additional component selected from the group consisting of an alkaline substance, inorganic polishing particles a water-soluble alcohol, a chelating agent and a buffering agent. In some embodiments, the polishing pad is applied to the sapphire surface with a downforce of about 5 psi to about 25 psi. In some embodiments, the polishing pad is rotated at a rate of about 40 rpm to about 120 rpm. In some embodiments, the polishing pad comprises a polyurethane impregnated polyester material. In some embodiments, the polishing pad has a compressibility of about 1% to about 40%. In some embodiments, the polishing pad has a Shore D hardness of about 50 to about 60. In some embodiments, the sapphire surface is a sapphire C-plane surface. In some embodiments, the sapphire surface is a sapphire R-plane surface.

The present invention is further directed to a kit for polishing a sapphire surface, the kit comprising a polishing composition comprising an effective amount of a colloidal aluminosilicate, wherein the composition has a pH of about 2.0 to about 7.0. In some embodiments, the kit further comprises a polishing pad comprising polyurethane impregnated with polyester, having a compressibility of about 5% to about 10% and a Shore D hardness of about 50 to about 60.

DETAILED DESCRIPTION

Figure 1:
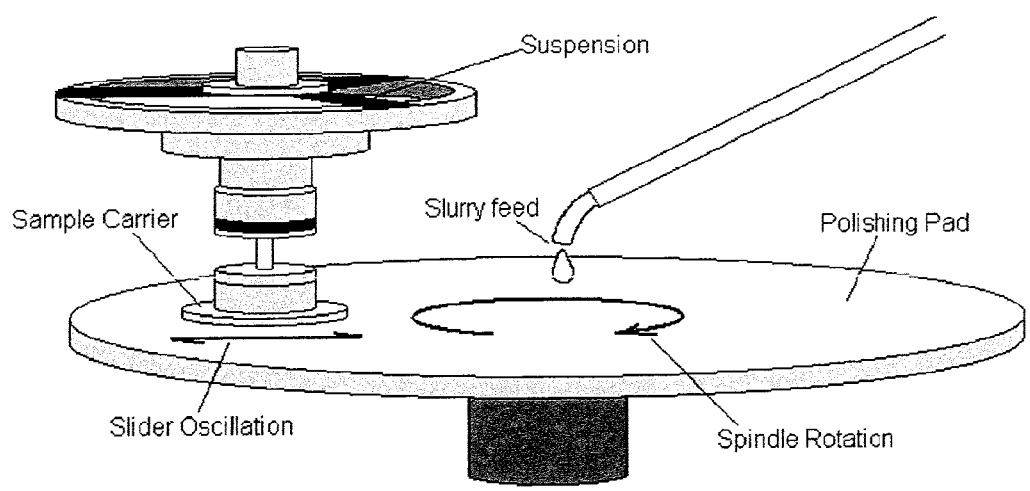
FIG. 1 is an illustration of a polishing system.

The present disclosure is directed to compositions, methods and kits for polishing sapphire surfaces, such as c-plane or r-plane wafers. The compositions include aluminosilicate particles in an aqueous acidic solution. Conventional sapphire polishing slurries comprising colloidal silica are effective at higher pH ranges. However, the compositions of the present disclosure include aluminum-doped colloidal silica, which provides the particles with an increased negative surface charge and increased stability in acidic environments.

The compositions comprise colloidal aluminosilicate particles in an aqueous solution, wherein the pH is from about 2.0 to about 7.0. In some embodiments, the colloidal aluminosilicate particles may have a narrow, unimodal particle size distribution, with an average particle size ranging from about 75 nm to about 125 nm. In other embodiments, the colloidal aluminosilicate particles may have a broad particle size distribution.

The compositions and kits comprising the composition may be used in methods of polishing sapphire surfaces, and they may enhance the chemical mechanical planarization of sapphire surfaces with increased material removal rates and concurrent reduced surface roughness of the sapphire substrate. The compositions may also have excellent stabilities and long shelf lives at low pH, which may preserve the morphological advantages of colloidal abrasive particles.

The resulting polished sapphire substrates may be used in a number of applications, including, but not limited to, light-emitting diodes (LEDs), semiconductors, optical lasers and telecommunication devices.

1. Definitions

The terminology used herein is for the purpose of describing particular embodiments only and is not intended to be limiting. As used in the specification and the appended claims, the singular forms "a," "and" and "the" include plural references unless the context clearly dictates otherwise.

Any ranges given either in absolute terms or in approximate terms are intended to encompass both, and any definitions used herein are intended to be clarifying and not limiting. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges (including all fractional and whole values) subsumed therein.

"Aluminosilicate" as used herein refers to a silica in which some of the silicon atoms are replaced with aluminum; in other words, aluminosilicate is a silica that is doped with aluminum. Aluminosilicate particles may include a silica core that is coated with an aluminosilicate layer, or may be particles in which the aluminum doping is present throughout the particle.

"Asker C" hardness means a measurement of the hardness of soft rubber and sponge, as measured by an Asker C hardness tester.

"Colloidal aluminosilicate composition" and other like terms including "colloidal," "sol," and the like refer to an aqueous two-phase system having a dispersed phase and a continuous phase. The colloidal aluminosilicate compositions used in the present invention have a solid phase dispersed or suspended in a continuous or substantially continuous liquid phase, typically an aqueous solution. Thus, the term "colloid" or "aluminosilicate sol" encompasses both phases, whereas "colloidal particles," "colloidal aluminosilicate," "aluminosilicate sol particles" or "particles" refers to the dispersed or solid phase.

"Material Removal Rate" or "MRR" refers to the amount of the material removed divided by the time interval. The MRR may be reported in mass per unit time (e.g., mg/min), or in units of nm/min for a given substrate. For example, the density of sapphire is 3.98 $g/cm^3$, an thus 0.001 gram loss is equivalent to a 55.1 nm uniform loss across the surface of the 3 inch (7.62 cm) wafer. Therefore, material removal rate can be calculated by the following conversion equation:

$$\text{Material Removal rate (nm/min)} = \frac{\text{wt loss (g)} \times 1000 \text{ mg/g} \times 55.1 \text{ nm/mg}}{\text{polishing time (min)}}$$

"Polishing composition" as used herein refers to a composition that includes a colloidal aluminosilicate composition and optional additional components, which may be used for polishing a sapphire surface. The polishing composition may include a colloidal aluminosilicate as a dispersed phase, an aqueous solution as a continuous phase, and optionally additional components selected from alkaline substances, other inorganic polishing particles, water-soluble alcohols, chelating agents, buffering agents, surfactants, emulsifying agents, viscosity modifiers, wetting agents, lubricants, soaps, and the like.

"Root-mean square roughness," "RMS roughness" or "$R_q$" are used interchangeably herein and refer to the standard deviation of the Z values within a given area, and is represented by Equation 1:

$$R_q = \left( \sum_{i=1}^{N} (Z_i - Z_{avg})^2 / N \right)^{1/2} . \quad \text{Eq. 1}$$

where $Z_{avg}$ is the average Z value within the given area, $Z_i$ is the Z value of interest (point or pixel), and N is the number of points within a given area. Thus, a perfectly flat surface would have $R_q=0$. A nonzero but low $R_q$ would indicate that although the surface may be rough, the features contributing to the roughness are all approximately equal. A high $R_q$ on the other hand would indicate a high degree of variability between features.

"Roughness average," "mean roughness" or "$R_a$" are used interchangably herein and refer to the arithmetic average of the deviations from the center plane and is represented by Equation 2:

$$R_a = \sum_{i=1}^{N} |Z_i - Z_{cp}| / N. \quad \text{Eq. 2}$$

where $Z_{cp}$ is the Z value of the center plane, $Z_i$ is again the Z value of interest, and N is the number of points in a given area.

"Shore C hardness" is a measurement of the hardness of hard rubbers, semi-rigid plastics and hard plastics, as measured by a Shore durometer. The different Shore Hardness scales measure the resistance of a material to indentation by a needle under a defined spring force.

"Shore D hardness" is a measurement of the hardness of hard rubbers, semi-rigid plastics and hard plastics, as measured by a Shore durometer. The different Shore Hardness scales measure the resistance of a material to indentation by a needle under a defined spring force.

"Stable" means that the solid phase of the colloid is present, dispersed through the medium and stable throughout this entire pH range with effectively no precipitate.

The "Z-value" is a measurement of the vertical height at a given point on a surface, as determined by Atomic Force Microscopy. The "Z-range" is the difference in height between the maximum and minimum features in an image area.

Zeta Potential measurements were determined by electrophoretic light scattering techniques using the Delsa Nano Submicron Particle Size and Zeta Potential Particle Analyzer, Beckman Coulter, Inc. (Fullerton, Calif.).

When an electric field is applied to charged particles in a colloidal suspension, the particles move toward the electrode opposite to its surface charge. Since the velocity is proportional to the amount of charge of the particles, zeta potential can be estimated by measuring the velocity of the particles. Electrophoretic light scattering, or the Laser Doppler Method, can be used to determine the velocity of particles moving in such a field. The particles are irradiated with a laser light, and the scattered light emitted from the particles is detected. Since the frequency of the scattered light is shifted from the incident light in proportion to the speed of the particles movement, the electrophoretic mobility of the particles can be measured from the frequency shift of the scattered light, employing the same principles as the Doppler Effect.

When measuring the zeta potential, the Delsa Nano detects the scattered light from the particles by combining incident light (reference light) with the scattered light. Since the intensity fluctuation of the combined light is equivalent to the frequency difference between the scattered and incident light observed, it is possible to precisely measure small frequency shifts.

The amount of frequency shift, $v_D$, of scattered light is related to the mobility of particles, U:

$$v_D = \frac{U_q}{2\pi} \cos \frac{\theta}{2} = \frac{U_n}{\lambda} \sin\theta$$

where:
q is the scattering vector=$4\pi n \sin(\theta/2)/\lambda$
$\lambda$ is the wavelength of the incident light
N is the refractive index of the medium and
$\theta$ is the scattering angle.

2. Compositions and Kits for Polishing Sapphire Surfaces

Described herein are polishing compositions and kits comprising the polishing compositions, wherein the polishing composition comprises colloidal aluminosilicate particles in an acidic aqueous solution. The kits may further comprise a polishing pad for polishing a sapphire surface. The compositions and kits may be used to abrade a sapphire surface. The kit may be used to produce material removal rates (MRRs) greater than or comparable to those achieved using analogous non-aluminum doped colloidal silica solutions. The kit may allow for use of lower concentrations of the polishing composition without loss in MRR. The kit may also further comprise instructions for polishing sapphire surfaces.

The kit may improve final surface roughness of a sapphire surface by providing a material removal rate (MRR) of about 10 nm/min to about 100 nm/min, e.g., about 10 nm/min, about 11 nm/min, about 12 nm/min, about 13 nm/min, about 14 nm/min, about 15 nm/min, 16 nm/min, 17 nm/min, 18 nm/min, 19 nm/min, 20 nm/min, 21 nm/min, 22 nm/min, 23 nm/min, 24 nm/min, 25 nm/min, 26 nm/min, 27 nm/min, 28 nm/min, 29 nm/min, 30 nm/min, 31 nm/min, 32 nm/min, 33 nm/min, 34 nm/min, 35 nm/min, 36 nm/min, 37 nm/min, 38 nm/min, 39 nm/min, 40 nm/min, 41 nm/min, 42 nm/min, 43 nm/min, 44 nm/min, 45 nm/min, 46 nm/min, 47 nm/min, 48 nm/min, 49 nm/min, 50 nm/min, 51 nm/min, 52 nm/min, 53 nm/min, 54 nm/min, 55 nm/min, 56 nm/min, 57 nm/min, 58 nm/min, 59 nm/min, 60 nm/min, 61 nm/min, 62 nm/min, 63 nm/min, 64 nm/min, 65 nm/min, 66 nm/min, 67 nm/min, 68 nm/min, 69 nm/min, 70 nm/min, 71 nm/min, 72 nm/min, 73 nm/min, 74 nm/min, 75 nm/min, 76 nm/min, 77 nm/min, 78 nm/min, 79 nm/min, 80 nm/min, 81 nm/min, 82 nm/min, 83 nm/min, 84 nm/min, 85 nm/min, 86 nm/min, 87 nm/min, 88 nm/min, 89 nm/min, 90 nm/min, 91 nm/min, 92 nm/min, 93 nm/min, 94 nm/min, 95 nm/min, 96 nm/min, 97 nm/min, 98 nm/min, 99 nm/min or 100 nm/min, depending upon the process temperature, the pounds per square inch (PSI) pressure, and the pad used on the sapphire surface.

The kit may achieve a material removal rate (MRR) from the sapphire surface of about 40.0 nm/min to about 100 nm/min, e.g., about 40.0 nm/min, 40.5 nm/min, 41.0 nm/min, 41.5 nm/min, 42.0 nm/min, 42.5 nm/min, 43.0 nm/min, 43.5 nm/min, 44.0 nm/min, 44.5 nm/min, 45.0 nm/min, 45.5 nm/min, 46.0 nm/min, 46.5 nm/min, 47.0 nm/min, 47.5 nm/min, 48.0 nm/min, 48.5 nm/min, 49.0 nm/min, 49.5 nm/min, 50.0 nm/min, 50.5 nm/min, 51.0 nm/min, 51.5 nm/min, 52.0 nm/min, 52.5 nm/min, 53.0 nm/min, 53.5 nm/min, 54.0 nm/min, 54.5 nm/min, 55.0 nm/min, 55.5 nm/min, 56.0 nm/min, 56.5 nm/min, 57.0 nm/min, 57.5 nm/min, 58.0 nm/min, 58.5 nm/min, 59.0 nm/min, 59.5 nm/min, 60.0 nm/min, 60.5 nm/min, 61.0 nm/min, 61.5 nm/min, 62.0 nm/min, 62.5 nm/min, 63.0 nm/min, 63.5 nm/min, 64.0 nm/min, 64.5 nm/min, 65.0 nm/min, 65.5 nm/min, 66.0 nm/min, 66.5 nm/min, 67.0 nm/min, 67.5 nm/min, 68.0 nm/min, 68.5 nm/min, 69.0 nm/min, 69.5 nm/min, 70.0 nm/min, 70.5 nm/min, 71.0 nm/min, 71.5 nm/min, 72.0 nm/min, 72.5 nm/min, 73.0 nm/min, 73.5 nm/min, 74.0 nm/min, 74.5 nm/min, 75.0 nm/min, 75.5 nm/min, 76.0 nm/min, 76.5 nm/min, 77.0 nm/min, 77.5 nm/min, 78.0 nm/min, 78.5 nm/min, 79.0 nm/min, 79.5 nm/min, 80.0 nm/min, 80.5 nm/min, 81.0 nm/min, 81.5 nm/min, 82.0 nm/min, 82.5 nm/min, 83.0 nm/min, 83.5 nm/min, 84.0 nm/min, 84.5 nm/min, 85.0 nm/min, 85.5 nm/min, 86.0 nm/min, 86.5 nm/min, 87.0 nm/min, 87.5 nm/min, 88.0 nm/min, 88.5 nm/min, 89.0 nm/min, 89.5 nm/min, 90.0 nm/min, 90.5 nm/min, 91.0 nm/min, 91.5 nm/min, 92.0 nm/min, 92.5 nm/min, 93.0 nm/min, 93.5 nm/min, 94.0 nm/min, 94.5 nm/min, 95.0 nm/min, 95.5 nm/min, 96.0 nm/min, 96.5 nm/min, 97.0 nm/min, 97.5 nm/min, 98.0 nm/min, 98.5 nm/min, 99.0 nm/min, 99.5 nm/min or 100.0 nm/min from a sapphire surface.

The kit may provide a root mean square (RMS) roughness, or $R_q$, of a sapphire surface of less than or equal to 5.0 Å, 4.9 Å, 4.8 Å, 4.7 Å, 4.6 Å, 4.5 Å, 4.4 Å, 4.3 Å, 4.2 Å, 4.1 Å, 4.0 Å, 3.9 Å, 3.8 Å, 3.7 Å, 3.6 Å, 3.5 Å, 3.4 Å, 3.3 Å, 3.2 Å, 3.1 Å, 3.0 Å, 2.9 Å, 2.8 Å, 2.7 Å, 2.6 Å, 2.5 Å, 2.4 Å, 2.3 Å, 2.2 Å, 2.1 Å, 2.0 Å, 1.9 Å, 1.8 Å, 1.7 Å, 1.6 Å, 1.5 Å, 1.4 Å, 1.3 Å, 1.2 Å, 1.1 Å or 1.0 Å after polishing of the sapphire surface for a period of time (e.g., about 180 minutes) from an initial RMS for a 20 micron by 20 micron surface area of up to 1 micron. Due to the roughness of the initial wafer, 1 micron by 1 micron areas cannot be accurately measured for RMS.

The kit may provide a roughness average, or $R_a$, of a sapphire 1 micron by 1 micron surface area of equal to or less than 14.5 Å, 4.4 Å, 4.3 Å, 4.2 Å, 4.1 Å, 4.0 Å, 3.9 Å, 3.8 Å, 3.7 Å, 3.6 Å, 3.5 Å, 3.4 Å, 3.3 Å, 3.2 Å, 3.1 Å, 3.0 Å, 2.9 Å, 2.8 Å, 2.7 Å, 2.6 Å, 2.5 Å, 2.4 Å, 2.3 Å, 2.2 Å, 2.1 Å, 2.0 Å, 1.9 Å, 1.8 Å, 1.7 Å, 1.6 Å, 1.5 Å, 11.4 Å, 1.3 Å, 1.2 Å, 1.1 Å or 1.0 Å after polishing of the sapphire surface for a period of time (e.g., about 180 minutes) from an initial $R_a$ for a 20 micron by 20 micron surface area of up to 1 micron. Due to the roughness of the initial wafer, 1 micron by 1 micron areas cannot be accurately measured for $R_a$.

a. Polishing Compositions

The kit for polishing a sapphire surface comprises a polishing composition. The polishing comprises colloidal aluminosilicate particles in an aqueous solution, having a pH of about 2.0 to about 7.0. The polishing composition may be an aqueous slurry of colloidal aluminosiliate particles in water (e.g., deionized water), with optional additional components.

i. Colloidal Aluminosilicate

The colloidal aluminosilicate particles may be fine amorphous, nonporous, and typically spherical particles in of silica ($SiO_2$) doped with aluminum (Al). The colloidal aluminosilicate particles may comprise silica that is doped with aluminum throughout the particle, or may comprise a silica core that is coated with an aluminosilicate shell.

The colloidal aluminosilicate particles may have a mean particle diameter of about 15 nm to about 150 nm, e.g., 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm or 150 nm.

In embodiments, the particle size distribution of colloidal aluminosilicate compositions can be defined by the ratio of the standard deviation of the distribution, σ, to the average particle diameter, r, as determined using transmission electron microscopy (TEM). Such a convention is described in U.S. Pat. No. 6,910,952. In some embodiments, colloidal aluminosilicate compositions that may be used in the methods and kits described herein may have a narrow particle size distribution, with values of σ/r of less than about 0.3, or less than about 0.2. For example, the colloidal aluminosilicate compositions may have a value of σ/r of about 0.29, 0.28, 0.27, 0.26, 0.25, 0.24, 0.23, 0.22, 0.21, 0.20, 0.19, 0.18, 0.17, 0.16, 0.15, 0.14, 0.13, 0.12, 0.11, 0.10, 0.09, 0.08, 0.07, 0.06, 0.05, 0.04, 0.03, 0.02, 0.01, or 0.00. The standard deviation of the particle size distribution of the colloidal silica particles, a, may be about 10 to about 20, e.g., 10.0, 10.1, 10.2, 10.3, 10.4, 10.5, 10.6, 10.7, 10.8, 10.9, 11.0, 11.1, 11.2, 11.3, 11.4, 11.5, 11.6, 11.7, 11.8, 11.9, 12.0, 12.1, 12.2, 12.3, 12.4, 12.5, 12.6, 12.7, 12.8, 12.9, 13.0, 13.1, 13.2, 13.3, 13.4, 13.5, 13.6, 13.7, 13.8, 13.9, 14.0, 14.1, 14.2, 14.3, 14.4, 14.5, 14.6, 14.7, 14.8, 14.9, 15.0, 15.1, 15.2, 15.3, 15.4, 15.5, 15.6, 15.7, 15.8, 15.9, 16.0, 16.1, 16.2, 16.3, 16.4, 16.5, 16.6, 16.7, 16.8, 16.9, 17.0, 17.1, 17.2, 17.3, 17.4, 17.5, 17.6, 17.7, 17.8, 17.9, 18.0, 18.1, 18.2, 18.3, 18.4, 18.5, 18.6, 18.7, 18.8, 18.9, 19.0, 19.1, 19.2, 19.3, 19.4, 19.5, 19.6, 19.7, 19.8, 19.9 or 20.0.

In some embodiments, colloidal aluminosilicate compositions that may be used in the methods and kits described herein may have a may have a broad particle size distribution, with values of σ/r of at least about 0.30 to about 0.70, e.g., about 0.30, 0.31, 0.32, 0.33, 0.34, 0.35, 0.36, 0.37, 0.38, 0.39, 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67, 0.68, 0.69, or 0.70. The standard deviation of the particle size distribution of the colloidal silica particles, σ, may be less than 10, e.g., 10.0, 9.9, 9.8, 9.7, 9.6, 9.5, 9.4, 9.3, 9.2, 9.1, 9.0, 8.9, 8.8, 8.7, 8.6, 8.5, 8.4, 8.3, 8.2, 8.1, 8.0, 7.9, 7.8, 7.7, 7.6, 7.5, 7.4, 7.3, 7.2, 7.1, 7.0, 6.9, 6.8, 6.7, 6.6, 6.5, 6.4, 6.3, 6.2, 6.1, 6.0, 5.9, 5.8, 5.7, 5.6, 5.5, 5.4, 5.3, 5.2, 5.1, 5.0, 4.9, 4.8, 4.7, 4.6, 4.5, 4.4, 4.3, 4.2, 4.1, 4.0, 3.9, 3.8, 3.7, 3.6, 3.5, 3.4, 3.3, 3.2, 3.1, 3.0, 2.9, 2.8, 2.7, 2.6, 2.5, 2.4, 2.3, 2.2, 2.1, 2.0, 1.9, 1.8, 1.7, 1.6, 1.5, 1.4, 1.3, 1.2, 1.1, 1.0, 0.9, 0.8, 0.7, 0.6, 0.5, 0.4, 0.3, 0.2, 0.1, or 0.0.

The colloidal aluminosilicate particles may be doped to include about 0.01 wt % to about 2.0 wt % Al based on silica, e.g., about 0.05 wt % to about 1.5 wt %, or about 0.1 wt % to about 1.25 wt %, or about 0.3 wt % to about 1.0 wt %. For example, the colloidal aluminosilicate particles may include about 0.01 wt %, 0.02 wt %, 0.03 wt %, 0.04 wt %, 0.05 wt %, 0.06 wt %, 0.07 wt %, 0.08 wt %, 0.09 wt %, 0.10 wt %, 0.11 wt %, 0.12 wt %, 0.13 wt %, 0.14 wt %, 0.15 wt %, 0.16 wt %, 0.17 wt %, 0.18 wt %, 0.19 wt %, 0.20 wt %, 0.21 wt %, 0.22 wt %, 0.23 wt %, 0.24 wt %, 0.25 wt %, 0.26 wt %, 0.27 wt %, 0.28 wt %, 0.29 wt %, 0.30 wt %, 0.31 wt %, 0.32 wt %, 0.33 wt %, 0.34 wt %, 0.35 wt %, 0.36 wt %, 0.37 wt %, 0.38 wt %, 0.39 wt %, 0.40 wt %, 0.41 wt %, 0.42 wt %, 0.43 wt %, 0.44 wt %, 0.45 wt %, 0.46 wt %, 0.47 wt %, 0.48 wt %, 0.49 wt %, 0.50 wt %, 0.51 wt %, 0.52 wt %, 0.53 wt %, 0.54 wt %, 0.55 wt %, 0.56 wt %, 0.57 wt %, 0.58 wt %, 0.59 wt %, 0.60 wt %, 0.61 wt %, 0.62 wt %, 0.63 wt %, 0.64 wt %, 0.65 wt %, 0.66 wt %, 0.67 wt %, 0.68 wt %, 0.69 wt %, 0.70 wt %, 0.71 wt %, 0.72 wt %, 0.73 wt %, 0.74 wt %, 0.75 wt %, 0.76 wt %, 0.77 wt %, 0.78 wt %, 0.79 wt %, 0.80 wt %, 0.81 wt %, 0.82 wt %, 0.83 wt %, 0.84 wt %, 0.85 wt %, 0.86 wt %, 0.87 wt %, 0.88 wt %, 0.89 wt %, 0.90 wt %, 0.91 wt %, 0.92 wt %, 0.93 wt %, 0.94 wt %, 0.95 wt %, 0.96 wt %, 0.97 wt %, 0.98 wt %, 0.99 wt %, 1.00 wt %, 1.01 wt %, 1.02 wt %, 1.03 wt %, 1.04 wt %, 1.05 wt %, 1.06 wt %, 1.07 wt %, 1.08 wt %, 1.09 wt %, 1.10 wt %, 1.11 wt %, 1.12 wt %, 1.13 wt %, 1.14 wt %, 1.15 wt %, 1.16 wt %, 1.17 wt %, 1.18 wt %, 1.19 wt %, 1.20 wt %, 1.21 wt %, 1.22 wt %, 1.23 wt %, 1.24 wt %, 1.25 wt %, 1.26 wt %, 1.27 wt %, 1.28 wt %, 1.29 wt %, 1.30 wt %, 1.31 wt %, 1.32 wt %, 1.33 wt %, 1.34 wt %, 1.35 wt %, 1.36 wt %, 1.37 wt %, 1.38 wt %, 1.39 wt %, 1.40 wt %, 1.41 wt %, 1.42 wt %, 1.43 wt %, 1.44 wt %, 1.45 wt %, 1.46 wt %, 1.47 wt %, 1.48 wt %, 1.49 wt %, 1.50 wt %, 1.51 wt %, 1.52 wt %, 1.53 wt %, 1.54 wt %, 1.55 wt %, 1.56 wt %, 1.57 wt %, 1.58 wt %, 1.59 wt %, 1.60 wt %, 1.61 wt %, 1.62 wt %, 1.63 wt %, 1.64 wt %, 1.65 wt %, 1.66 wt %, 1.67 wt %, 1.68 wt %, 1.69 wt %, 1.70 wt %, 1.71 wt %, 1.72 wt %, 1.73 wt %, 1.74 wt %, 1.75 wt %, 1.76 wt %, 1.77 wt %, 1.78 wt %, 1.79 wt %, 1.80 wt %, 1.81 wt %, 1.82 wt %, 1.83 wt %, 1.84 wt %, 1.85 wt %, 1.86 wt %, 1.87 wt %, 1.88 wt %, 1.89 wt %, 1.90 wt %, 1.91 wt %, 1.92 wt %, 1.93 wt %, 1.94 wt %, 1.95 wt %, 1.96 wt %, 1.97 wt %, 1.98 wt %, 1.99 wt %, or 2.00 wt % aluminum (Al) based on silica.

The colloidal aluminosilicate particles may be prepared by any suitable means known in the art. For example, colloidal aluminosilicates may be prepared in which aluminum is incorporated throughout the particle by metal oxide n-type doping, where aluminum is substituted for Si in the lattice of colloidal silica particles (i.e. doped colloidal silica).

Silicic acid is the starting material for preparing colloidal silica, which is formed by passing sodium silicate solution through a bed of H$^+$ cation exchange resin. The resulting silicic acid solution is very reactive and needs to be cooled to retard polymerization. In order to create aluminum doped colloidal silica, the aluminum species is added to the prepared silicic acid. Suitable aluminum species that may be used as starting materials include aluminum chlorohydrate and Al$_2$(OH)$_5$.2H$_2$O It may be possible to create aluminum doped colloidal silica with an aluminum content exceeding 10,000 ppm. The final products show unique characteristics of the as-synthesized doped colloids, e.g., increased negative surface charge at pH 2-7.

In some embodiments, the colloidal aluminosilicate particles have a colloidal silica core onto which an aluminosilicate shell is grown. The aluminosilicate is made by "doping" silicic acid with aluminum as described above. The shell is then grown onto the silica particles until the particles are of the desired diameter.

Following preparation, the colloidal aluminosilicate particles can then be deionized with cationic H$^+$ exchange resin to produce an acidic colloidal slurry which is stable over the pH range of 3-10.

Further description of methods of preparing colloidal aluminosilicates can be found, for example, in US 2005/0234136, which is incorporated herein by reference.

ii. Liquid Phase

The polishing composition further comprises a liquid phase in order to generate a slurry. For example, the liquid phase may be deionized water. Either prior to or following formation of the slurry of colloidal silica in the liquid phase, the pH may be adjusted to about 2.0 to about 7.0, or about 3.0 to about 6.5. For example, the pH may be adjusted to about 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9, 6.0, 6.1, 6.2, 6.3, 6.4, 6.5, 6.6, 6.7, 6.8, 6.9 or 7.0. The pH may be adjusted using an acid such as hydrochloric acid, nitric acid, phosphoric acid, sulfuric acid, acetic acid, citric acid, oxalic acid, or the like. Alternatively, the pH may be adjusted using a cation exchange resin, e.g., by passing the composition through a cation exchange column. Suitable columns are available, for example, under the trade name Dowex®. An exemplary resin is Dowex® 650C resin.

The polishing composition may have a zeta potential that is less than about −20 mV, less than about −25 mV, less than −30 mV, or from about −20 mV to about −60 mV. For example, the polishing composition may have a zeta potential of about −20 mV, −21 mV, −22 mV, −23 mV, −24 mV, −25 mV, −26 mV, −27 mV, −28 mV, −29 mV, −30 mV, −31 mV, −32 mV, −33 mV, −34 mV, −35 mV, −36 mV, −37 mV, −38 mV, −39 mV, −40 mV, −41 mV, −42 mV, −43 mV, −44 mV, −45 mV, −46 mV, −47 mV, −48 mV, −49 mV, −50 mV, −51 mV, −52 mV, −53 mV, −54 mV, −55 mV, −56 mV, −57 mV, −58 mV, −59 mV, or −60 mV.

iii. Optional Additional Components

In embodiments, the polishing composition may further include one or more of the following additives:

A) Alkaline substances, such as sodium hydroxide, quaternary ammonium bases and its salt, water soluble amines such as monoethanolamine, alkali metal salts including nitrates, chlorides, sulfates and the like.

B) Inorganic polishing particles such as non-oxide sols, including diamond, boron nitride, silicon nitride, silicon carbide, etc. Similarly, zirconia, zirconium silicate, mullite, cerium oxide, iron oxide, chromium oxide, titanium oxide, tin oxide and the like can be added. Similarly, the composition may contain hydrated oxides such as aluminum hydroxide, boehmite, goethite.

C) Water-soluble alcohols such as ethanol, propanol, ethylene glycol, propylene glycol, and the like.

D) Chelating agents, for example, one or more amine or amide containing chelants such as ethylenediaminetetraacetic acid, ethyldiamine and methyleformaide and organic acids, such as oxalic acid or iminodiacetic acid.

E) Buffering agents. Buffered compositions can be adjusted to span the pH range from near-neutral to acidic. Mono, di and polyprotic acids may act as buffers, and when fully or partially de-protonated with bases such as ammonium hydroxide. Ammonium salts of the acids are suitable, but other alkali and alkaline earth metal salts of the carboxylic acids may be used. Representative examples include salts of carboxylic acids include, for example, mono-carboxylic acids, di-carboxylic acids, tri-carboxylic acids, and poly-carboxylic acids. Specific compounds include, for example, malonic acid, oxalic acid, citric acid, tartaric acid, succinic acid, malic acid, adipic acid, salts thereof, and mixtures thereof. Nitrogen containing compounds that may buffer the slurry include: aspartic acid, glutamic acid, histidine, lysine, arginine, ornithine, cysteine, tyrosine, and carnosine, bis(2-hydroxyethyl)iminotris(hydroxymethyl) methane, tris(hydroxymethyl)aminomethane, N-(2-Acetamido)-2-iminodiacetic acid, 1,3-bis[tris(hydroxymethyl) methylamino]propane, triethanolamine, N-tris (hydroxymethyl)methylglycine, N,N-bis(2-hydroxyethyl) glycine, and glycine. Ammonium hydrogen phosphate may also be used in the slurry.

F) Surfactants, emulsifying agents, viscosity modifiers, wetting agents, lubricants, soaps, and the like. Typical surfactants include non-ionic, anionic, cationic, zwitterionic, amphoteric and polyeletrolyte compounds. Examples include organic acids, alkane sulfates, alkaline sulfonates, hydroxides, substituted amine salts, betaines, polyethylene oxide, polyvinyl alcohol, polyvinyl acetate, polyacrylic acid, polyvinyl pyrolidone, polyethyleneimine, sodium alkylbenzenesulfonatem tetramethyl ammonium halides, cetyl trimethyl ammonium halides, nonyl ethers, and combinations thereof.

b. Kits

The kit for polishing a sapphire surface comprises the polishing composition, and may also further comprise a polishing pad and/or instructions for polishing sapphire surfaces.

i. Polishing Pads

The kit may further comprise a polishing pad to be used in conjunction with the polishing composition to treat the sapphire surface. The polishing pad may comprise a resin, or a woven or non-woven material. For example, the polishing pad may include a polyurethane impregnated fiber-based material, such as a polyester felt or suede.

The polishing pad may have a compressibility of about 1%, 1.5%, 2%, 2.5%, 3%, 3.5%, 4%, 4.5%, 5%, 5.5%, 6%, 6.5%, 7%, 7.5%, 8%, 8.5%, 9%, 9.5%, 10%, 10.5%, 11%, 11.5%, 12%, 12.5%, 13%, 13.5%, 14%, 14.5%, 15%, 15.5%, 16%, 16.5%, 17%, 18%, 18.5%, 19%, 19.5%, 20%, 20.5%, 21%, 21.5%, 22%, 22.5%, 23%, 23.5%, 24%, 24.5%, 25%, 25.5%, 26%, 26.5%, 27%, 27.5%, 28%, 28.5%, 29%, 29.5%, 30%, 30.5%, 31%, 31.5%, 32%, 32.5%, 33%, 33.5%, 34%, 34.5%, 35%, 35.5%, 36%, 36.5%, 37%, 37.5%, 38%, 38.5%, 39%, 39.5% or 40%.

The polishing pad may have a Shore C hardness of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100.

The polishing pad may have a Shore D hardness of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100.

The polishing pad may have an Asker C hardness of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100.

Suitable pads are available under the trade name SUBA™ from Rohm & Haas. For example, a SUBA™ 500 pad has a relatively low compressibility (about 13%) and a Shore D hardness of about 55. A SUBA™ 600 pad has a compressibility of about 4% and an Asker C hardness of about 80. A SUBA™ 800 pad has a compressibility of about 4% and an Asker C hardness of about 82.

ii. Other Elements

The kit may further comprise additional elements. For example, a kit may also include instructions for use of the polishing composition and/or the polishing pad. Instructions included in kits can be affixed to packaging material or can be included as a package insert. While the instructions are typically written or printed materials they are not limited to such. Any medium capable of storing such instructions and communicating them to an end user is contemplated by this disclosure. Such media include, but are not limited to, electronic storage media (e.g., magnetic discs, tapes, cartridges, chips), optical media (e.g., CD, DVD), and the like. As used herein, the term "instructions" can include the address of an internet site that provides the instructions. The various components of the kit optionally are provided in suitable containers as necessary, e.g., a bottle, jar or vial.

3. Methods of polishing sapphire surfaces

Disclosed herein are also methods for polishing sapphire surfaces using the compositions and kits as described. The method comprises abrading a sapphire surface with a rotating polishing pad and a polishing composition, wherein the polishing composition comprises an effective amount of colloidal aluminosilicate, and has a pH of about 1.0 to about 4.0.

For example, the methods disclosed herein may involve chemical mechanical polishing (CMP). The main objectives of CMP are to smooth surface topography of dielectric deposits to enable multilevel metallization, or to remove excess coating material to produce inlaid metal damascene structures and shallow isolation trenches. While the mechanisms of material removal in CMP are not completely understood, in general the oxide substrates can be chemically treated at the surface to quickly create a more brittle or softer thin film. This surface film is then "gently" abraded to a uniform planarity using formulations containing both chemical and abrasive components.

In the methods of the invention, the polishing composition may be applied to a surface of a sapphire surface, such as a wafer, mounted in a rotating or non-rotating carrier. The sapphire surface may then be abraded using the polishing pad (e.g., a rotating polishing pad). Typically, at least a portion of the polishing slurry remains disposed between the polishing surface of the pad and the surface of the sapphire surface during the process. The polishing pad has a planar polishing surface that may rotate about an axis of rotation perpendicular to the sapphire surface at a selected rotation rate. The polishing surface of the pad is pressed against the sapphire surface with a selected level of down-force perpendicular to the sapphire surface. The polishing composition may be applied to the sapphire surface by continuously supplying the slurry onto the sapphire surface while the polishing pad is pressed against the sapphire surface.

The combined action of the rotating polishing pad and polishing slurry may remove sapphire from the surface at a rate that is greater than the sapphire removal rate achievable by abrading the sapphire surface with the same pad, at the same rate of rotation, and the same down-force, using a polishing composition made with an analogous non-aluminum doped colloidal silica solution.

The polishing pad may be pressed against the sapphire surface with a down-force of about 5 psi to about 25 psi, e.g., about 5 psi to about 20 psi, or about 5 psi to about 10 psi.

For example, the pad may be applied to the sapphire surface with a down-force of about 5, 6, 7, 8, 9, 10, 11, 12, 13, 14, 15, 16, 17, 18, 19, 20, 21, 22, 23, 24 or 25 psi. The polishing pad may be rotated at a rate of about 40 to about 120 revolutions per minute (rpm), or about 60 to 80 rpm. For example, the polishing pad may be rotated at a rate of about 40, 45, 50, 55, 60, 65, 70, 75, 80, 85, 90, 95, 100, 105, 110, 115 or 120 rpm.

In the methods, the sapphire surface may be polished for about 60 min, 65 min, 70 min, 75 min, 80 min, 85 min, 90 min, 95 min, 100 min, 105 min, 110 min, 115 min, 120 min, 125 min, 130 min, 140 min, 145 min, 150 min, 155 min, 160 min, 165 min, 170 min, 175 min, 180 min, 185 min, 190 min, 195 min, 200 min, 205 min, 210 min, 215 min, 220 min or 225 min.

The methods may be useful for polishing or planarizing a C-plane or R-plane surface of a sapphire wafer, and may provide material removal rates that are significantly higher than those achieved with conventional abrasive slurries, such as those having non-aluminum doped colloidal silica particles. Removal rates may be at least about 10%, 15%, 20%, 25%, 30%, 35%, 40%, 45%, 50%, 55%, 60%, 65%, 70%, 75%, 80%, 85% or 90% higher the removal rate obtainable with a slurry having non-aluminum doped colloidal silica particles.

The methods can be carried out utilizing any abrasive polishing equipment. Suitably, the polishing is accomplished with sapphire wafers mounted in a rotating or non-rotating carrier, using a polishing pad applied to the surface of the wafers at a selected down-force (e.g., with a down-force in the range of about 2 to about 20 psi) at a selected pad rotation rate (e.g., about 20 to about 150 rpm), with the wafers mounted on a carrier rotating an optionally at a selected rotation rate (e.g., about 0 rpm to about 150 rpm). Suitable polishing equipment is commercially available from a variety of sources, such as CETR (Campbell, Calif.). For example, a CP-4 CMP testing instrument may be used.

The method may improve final surface roughness of a sapphire surface by providing a material removal rate (MRR) of about 10 nm/min to about 100 nm/min, e.g., about 10 nm/min, about 11 nm/min, about 12 nm/min, about 13 nm/min, about 14 nm/min, about 15 nm/min, 16 nm/min, 17 nm/min, 18 nm/min, 19 nm/min, 20 nm/min, 21 nm/min, 22 nm/min, 23 nm/min, 24 nm/min, 25 nm/min, 26 nm/min, 27 nm/min, 28 nm/min, 29 nm/min, 30 nm/min, 31 nm/min, 32 nm/min, 33 nm/min, 34 nm/min, 35 nm/min, 36 nm/min, 37 nm/min, 38 nm/min, 39 nm/min, 40 nm/min, 41 nm/min, 42 nm/min, 43 nm/min, 44 nm/min, 45 nm/min, 46 nm/min, 47 nm/min, 48 nm/min, 49 nm/min, 50 nm/min, 51 nm/min, 52 nm/min, 53 nm/min, 54 nm/min, 55 nm/min, 56 nm/min, 57 nm/min, 58 nm/min, 59 nm/min, 60 nm/min, 61 nm/min, 62 nm/min, 63 nm/min, 64 nm/min, 65 nm/min, 66 nm/min, 67 nm/min, 68 nm/min, 69 nm/min, 70 nm/min, 71 nm/min, 72 nm/min, 73 nm/min, 74 nm/min, 75 nm/min, 76 nm/min, 77 nm/min, 78 nm/min, 79 nm/min, 80 nm/min, 81 nm/min, 82 nm/min, 83 nm/min, 84 nm/min, 85 nm/min, 86 nm/min, 87 nm/min, 88 nm/min, 89 nm/min, 90 nm/min, 91 nm/min, 92 nm/min, 93 nm/min, 94 nm/min, 95 nm/min, 96 nm/min, 97 nm/min, 98 nm/min, 99 nm/min or 100 nm/min, depending upon the process temperature, the pounds per square inch (PSI) pressure, and the pad used on the sapphire surface. The method may achieve a material removal rate (MRR) from the sapphire surface of about 40.0 nm/min to about 100 nm/min, e.g., about 40.0 nm/min, 40.5 nm/min, 41.0 nm/min, 41.5 nm/min, 42.0 nm/min, 42.5 nm/min, 43.0 nm/min, 43.5 nm/min, 44.0 nm/min, 44.5 nm/min, 45.0 nm/min, 45.5 nm/min, 46.0 nm/min, 46.5 nm/min, 47.0 nm/min, 47.5 nm/min, 48.0 nm/min, 48.5 nm/min, 49.0 nm/min, 49.5 nm/min, 50.0 nm/min, 50.5 nm/min, 51.0 nm/min, 51.5 nm/min, 52.0 nm/min, 52.5 nm/min, 53.0 nm/min, 53.5 nm/min, 54.0 nm/min, 54.5 nm/min, 55.0 nm/min, 55.5 nm/min, 56.0 nm/min, 56.5 nm/min, 57.0 nm/min, 57.5 nm/min, 58.0 nm/min, 58.5 nm/min, 59.0 nm/min, 59.5 nm/min, 60.0 nm/min, 60.5 nm/min, 61.0 nm/min, 61.5 nm/min, 62.0 nm/min, 62.5 nm/min, 63.0 nm/min, 63.5 nm/min, 64.0 nm/min, 64.5 nm/min, 65.0 nm/min, 65.5 nm/min, 66.0 nm/min, 66.5 nm/min, 67.0 nm/min, 67.5 nm/min, 68.0 nm/min, 68.5 nm/min, 69.0 nm/min, 69.5 nm/min, 70.0 nm/min, 70.5 nm/min, 71.0 nm/min, 71.5 nm/min, 72.0 nm/min, 72.5 nm/min, 73.0 nm/min, 73.5 nm/min, 74.0 nm/min, 74.5 nm/min, 75.0 nm/min, 75.5 nm/min, 76.0 nm/min, 76.5 nm/min, 77.0 nm/min, 77.5 nm/min, 78.0 nm/min, 78.5 nm/min, 79.0 nm/min, 79.5 nm/min, 80.0 nm/min, 80.5 nm/min, 81.0 nm/min, 81.5 nm/min, 82.0 nm/min, 82.5 nm/min, 83.0 nm/min, 83.5 nm/min, 84.0 nm/min, 84.5 nm/min, 85.0 nm/min, 85.5 nm/min, 86.0 nm/min, 86.5 nm/min, 87.0 nm/min, 87.5 nm/min, 88.0 nm/min, 88.5 nm/min, 89.0 nm/min, 89.5 nm/min, 90.0 nm/min, 90.5 nm/min, 91.0 nm/min, 91.5 nm/min, 92.0 nm/min, 92.5 nm/min, 93.0 nm/min, 93.5 nm/min, 94.0 nm/min, 94.5 nm/min, 95.0 nm/min, 95.5 nm/min, 96.0 nm/min, 96.5 nm/min, 97.0 nm/min, 97.5 nm/min, 98.0 nm/min, 98.5 nm/min, 99.0 nm/min, 99.5 nm/min or 100.0 nm/min from a sapphire surface.

The method may provide a root mean square (RMS) roughness, or $R_q$, of a sapphire 1 micron by 1 micron surface area of less than or equal to 5.0 Å, 4.9 Å, 4.8 Å, 4.7 Å, 4.6 Å, 4.5 Å, 4.4 Å, 4.3 Å, 4.2 Å, 4.1 Å, 4.0 Å, 3.9 Å, 3.8 Å, 3.7 Å, 3.6 Å, 3.5 Å, 3.4 Å, 3.3 Å, 3.2 Å, 3.1 Å, 3.0 Å, 2.9 Å, 2.8 Å, 2.7 Å, 2.6 Å, 2.5 Å, 2.4 Å, 2.3 Å, 2.2 Å, 2.1 Å, 2.0 Å, 1.9 Å, 1.8 Å, 1.7 Å, 1.6 Å, 1.5 Å, 1.4 Å, 1.3 Å, 1.2 Å, 1.1 Å or 1.0 Å after polishing of the sapphire surface for a period of time (e.g., about 180 minutes). The initial wafer roughness has an RMS of up to 1 micron for a 25 micron by 25 micron surface area. Due to the roughness of the initial wafer, a 1 micron by 1 micron surface areas cannot be analyzed accurately.

The method may provide a roughness average, or $R_a$, of a sapphire 1 micron by 1 micron surface area of equal to or less than 14.5 Å, 4.4 Å, 4.3 Å, 4.2 Å, 4.1 Å, 4.0 Å, 3.9 Å, 3.8 Å, 3.7 Å, 3.6 Å, 3.5 Å, 3.4 Å, 3.3 Å, 3.2 Å, 3.1 Å, 3.0 Å, 2.9 Å, 2.8 Å, 2.7 Å, 2.6 Å, 2.5 Å, 2.4 Å, 2.3 Å, 2.2 Å, 2.1 Å, 2.0 Å, 1.9 Å, 1.8 Å, 1.7 Å, 1.6 Å, 1.5 Å, 11.4 Å, 1.3 Å, 1.2 Å, 1.1 Å or 1.0 Å after polishing of the sapphire surface for a period of time (e.g., about 180 minutes). The initial wafer roughness has an $R_a$ of up to 1 micron for a 25 micron by 25 micron surface area. Due to the roughness of the initial wafer, a 1 micron by 1 micron surface areas cannot be analyzed accurately.

The method may also allow for effective polishing of a sapphire surface without significant increases in temperature above the set temperature during the polishing process. For example, the temperature may increase by less than 0.1, 0.2, 0.3, 0.4, 0.5, 0.6, 0.7, 0.8, 0.9, 1, 2, 3, 4, 5, 6, 7, 8, 9 or 10° C. during the polishing.

The Coefficient of Friction (CoF) may be monitored over the course of a polish time (e.g., a polish time described herein, such as 180 min). Such monitoring may indicate that the CoF increases by about 0.05, 0.10, 0.15, 0.20, 0.25, 0.30, 0.35, 0.40, 0.45 or 0.50 over the course of the polish time.

The invention encompasses any and all possible combinations of some or all of the various embodiments described herein. Any and all patents, patent applications, scientific papers, and other references cited in this application, as well as any references cited therein, are hereby incorporated by reference in their entirety.

The present invention has multiple aspects, some of which are illustrated by the following non-limiting examples.

EXAMPLES

General Materials and Methods 3 inch diameter c-plane (0001) as-lapped sapphire wafers were obtained from Roditi, Inc. Polishing pads were purchased from Eminess Technologies of Monroe, N.C. All polishing experiments were conducted using a CP-4 CMP testing instrument, manufactured by CETR of Campbell, Calif. A schematic of the polishing process is shown in FIG. 1.

AFM images were obtained with a Digital Instruments Dimension 3100 microscope from Veeco Metrology Group, equipped with a Nanoscope Ma controller. Images were collected in contact mode using either a Vistaprobe CSR-10 etched silicon probe tip (length 225 μm, resonant frequency of 28 kHz, nominal spring constant 0.1N/m) or an Applied Nano Sicon probe (13 kHz resonant frequency, 0.17 N/m nominal spring constant).

In order to obtain statistically significant data on roughness and other surface characteristics, a minimum of five locations were normally examined on each sapphire wafer, evaluating the center as well as the edges of the wafer at several locations. Generally, five different square image areas were examined: 75 μm, 25 μm, 5 μm, 1 μm, and 500 nm. Data was analyzed with the Digital Instruments Nanoscope IIIa$^R$ software, version 5.31r1. Top view and surface plots were constructed and surface roughness calculations performed on the original height data. The only data manipulation consisted of standard $2^{nd}$ or $3^{rd}$ order plane-fits and first order flatten parameters to remove piezoelectric hysteresis effects common with piezo scanners. $2^{nd}$ order plane-fits were generally applied to smaller area images such as 1 μm-10 μm areas while $3^{rd}$ order plane-fits were applied to larger areas.

Zeta Potential measurements were determined by electrophoretic light scattering techniques using the Delsa Nano Submicron Particle Size and Zeta Potential Particle Analyzer, Beckman Coulter, Inc. (Fullerton, Calif.).

For the zeta potential measurements reported herein, one-point data at fixed pH values were performed. Standard 0.1N solutions of NaOH were used for pH adjustments. The colloidal slurries were first deionized using H+ cation exchange resin (Dowex 650C H+ resin) to obtain slurries at pH of below pH 3 and titrated with the NaOH, with aliquots used for zeta potential measurements.

Example 1

Preparation of Colloidal Aluminosilicate Sols

Preparation of the silicic acid solution
Sodium silicate was added to deionized (DI) water at a ratio required to generate a final solution of 6.5-7.0 weight % solids (expressed as % $SiO_2$). The solution was then passed through a column containing a cation exchange resin (Dowex 650C ($H^+$)). About 40 mL of resin for each 100 g of diluted sodium silicate solution was used to produce a silicic acid solution. This resulted in a silicic acid solution of pH 2 and weight percent solids of 6.5%.

Preparation of the aluminum doped silicic acid
To the silicic acid solution, a suitable amount of a 50% by weight solution of aluminum chlorohydrate was added to produce the desired concentration (ppm) of aluminum based on silica (BOS) was added. For Aluminosilicate I, the weight ratio of aluminum chlorohydrate solution to silicic acid solution is 1.9:1000. For Aluminosilicate II, the weight ratio of aluminum chlorohydrate solution to silicic acid solution is 4.4:1000.

This solution was mixed for 30 minutes prior to further use to allow for pH equilibration and complete aluminum incorporation into the acid.

Preparation of Colloidal Silica and Aluminosilicate Sols
Reference Composition A and Compositions 1 and 2 were prepared under identical process conditions as described below, the only difference being the nature of the silicic acid used to grow the shell around the preexisting particle. In order to grow uniform, spherical particles with a tight, unimodal particle size distribution, a preexisting colloidal silica sol with unimodal particle size distribution of approximately 80 nm was used and a "aluminosilicate shell" of approximately 15 to 20 nm in size was grown on top of the preexisting particles.

Reference Composition A
Into the reactor, a solution of an 80 nm colloidal silica sol (Nalco 2329K) and DI water was blended to result in a concentration of 17-18 weight % solids. To this was added 50% sodium hydroxide at 1 weight % of the total reactants weight. This blend was then heated to 260° F. with constant agitation.

Over the course of 1.4 hours, the silicic acid as described above was added to the constantly stirred reactor until the total silica solids reached 8.2 weight % solids and the colloidal particle size as measured by Dynamic Light Scattering (DLS) was approximately 100 nm. The silicic acid feed was then stopped and the reactor was held at temperature under constant stirring for an additional 30 minutes.

Upon cooling to approximately 160° F., the reaction product was concentrated to 47% solids via ultrafiltration.

Figure 2:
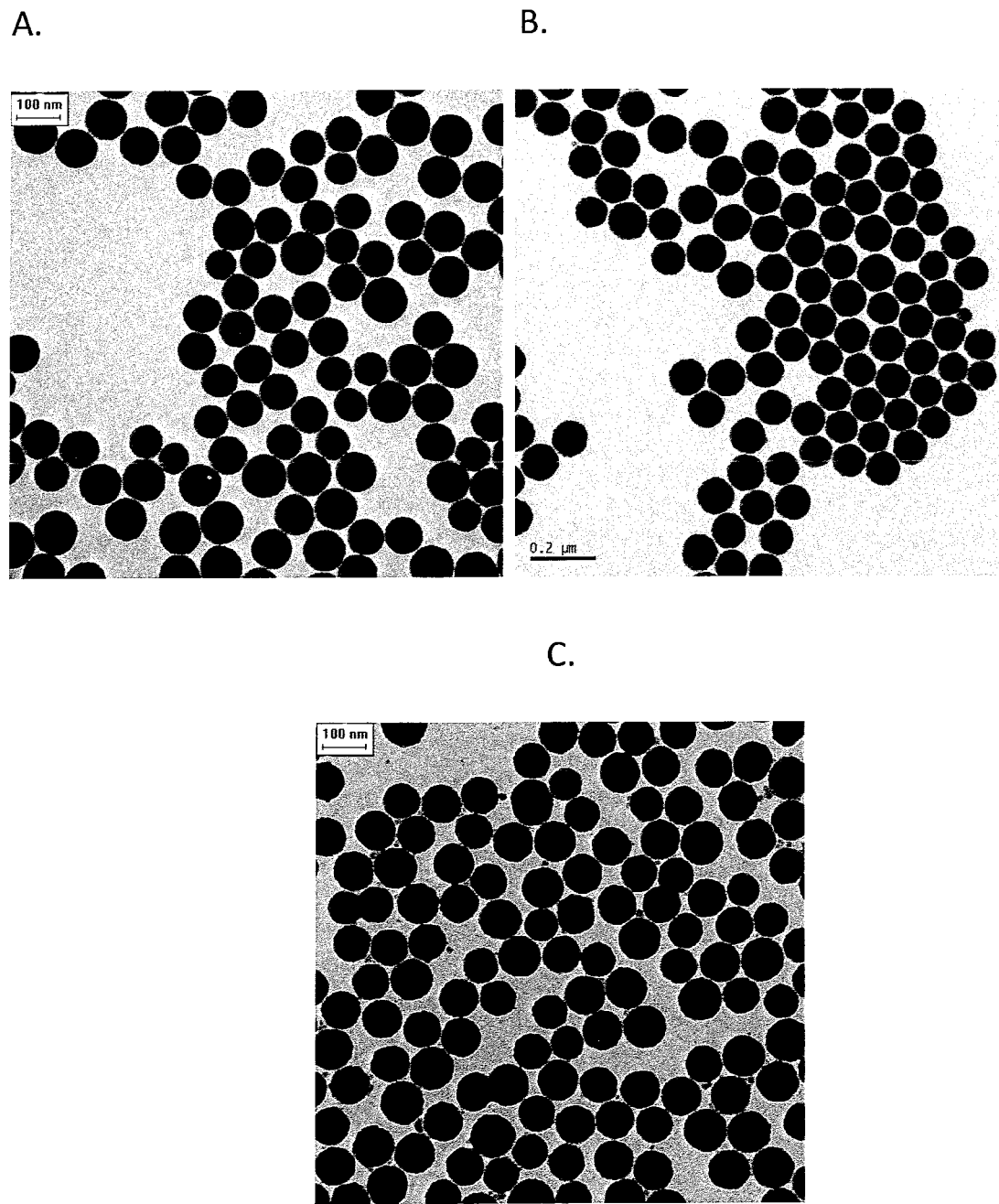
FIG. 2 shows TEM images of colloidal silica and aluminosilicate compositions described herein: A) Reference Composition A; B) Composition 1; and C) Composition 2.

A representative TEM image of Reference Composition A particles is shown in FIG. 2A.

Compositions 1 and 2
Into the reactor, a solution of an 80 nm colloidal silica sol (Nalco 2329K) and DI water were blended to result in a concentration of 17-18% solids. To this was added 50% sodium hydroxide at 1% of the total reactants weight. This blend was then heated to 260° F. with constant agitation.

Over the course of 1.4 hours, either Aluminosilicate I or Aluminosilicate II as described above was added to the constantly stirred reactor until the total silica solids reaches 8.2% solids and the colloidal particle size as measured by Dynamic Light Scattering (DLS) is approximately 130 nm. The silicic acid feed is then stopped and the reactor is held at temperature under constant stirring for an additional 30 minutes.

Upon cooling the reactor to approximately 160° F., the reaction product was concentrated to 47% solids via ultrafiltration.

Composition 1 was prepared with Aluminosilicate I, and Composition 2 was prepared with Aluminosilicate II.

A representative TEM image of Composition 1 particles is shown in FIG. 2C.

Figure 3:
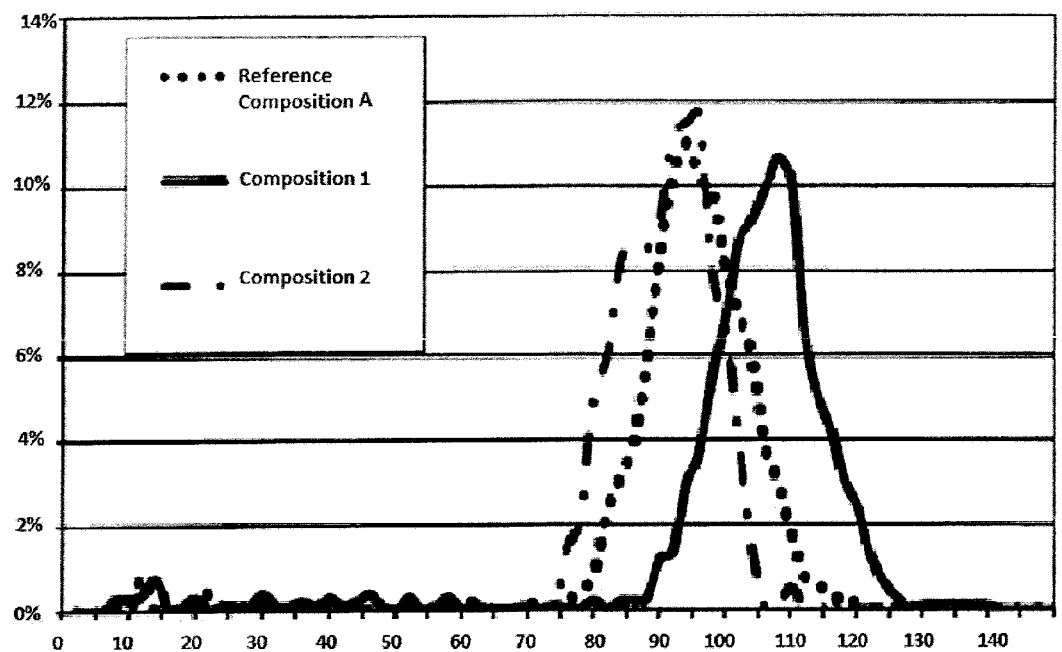
FIG. 3 is a graph of particle size distributions of colloidal silica and aluminosilicate compositions.

Properties of Reference Composition A and Compositions 1 and 2 are further summarized in Table 1. Particle size distributions for Reference Composition A and Composition 1 are shown in FIG. 3.

TABLE 1

Properties of Colloidal Silica and Aluminosilicate Compositions

| Product | pH | % SiO$_2$ by Ash solids (%) | Mean Particle Size by DLS (nm) | Mean Particle Size by TEM (nm) | wt % Al BOS |
|---|---|---|---|---|---|
| Reference Composition A | 10.4 | 48 | 92 | 96.6 | N/A |
| Composition 1 | 9.31 | 47.0 | 97.6 | 101.7 | 0. 0.232 |
| Composition 2 | 10.2 | 30.6 | 101.0 | 86.6 | 0.535 |

Final Polishing Slurries

The pH of the above compositions were adjusted by passing the colloidal silicate or aluminosilicate sols through a column containing a cation exchange resin (Dowex 650C (H$^+$)). About 40 mL of resin for each 200 g of 47% colloidal sol was used to produce an acid stabilized solution. The resultant acid stabilized sols, herein described as "deionized", had an initial pH 2 to pH 3 and percent solids of 45-46%.

A second method to produce the low pH sols was to adjust the pH using 0.1M H$_3$PO$_4$. The resultant acid stabilized sols, herein described as "Acid Adjusted," had an initial pH 2 to pH 3 and percent solids of 46 to 47%.

Working polishing slurries were made by diluting the slurries made above to 20 weight % solids using DI water. Any further pH adjustments were made by addition of 0.1M NaOH or 0.1M H$_3$PO$_4$ to the appropriate slurry.

Example 2

Zeta Potential Measurements

Figure 4:
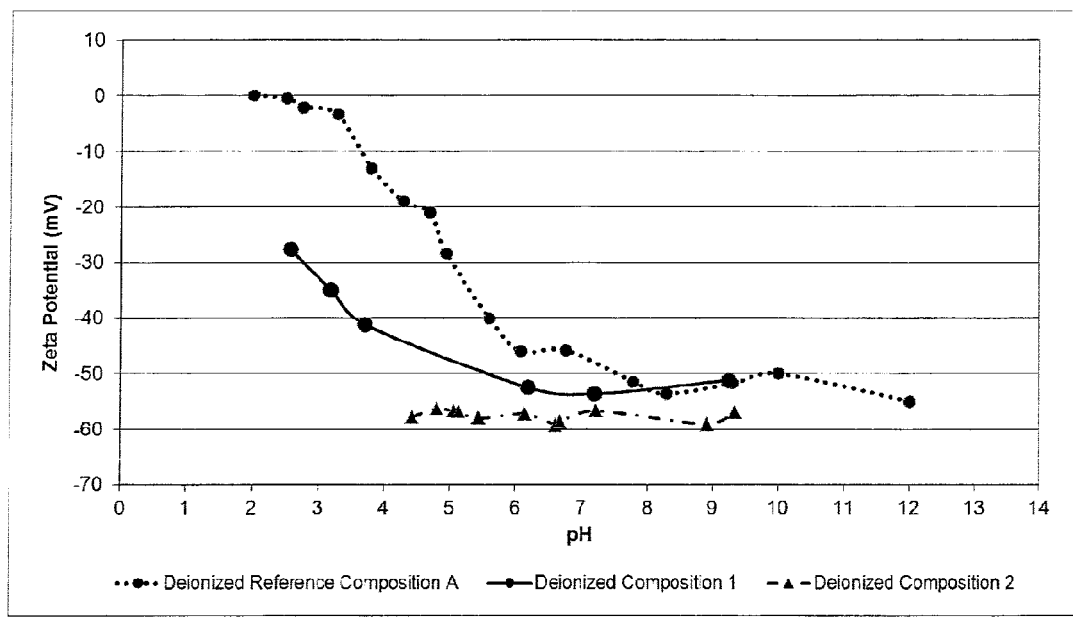
FIG. 4 is a graph of zeta potential measurements of colloidal silica and aluminosilicate compositions described herein, as a function of pH.

The zeta potentials of deionized Reference Composition A, deionized Composition 1 and deionized Composition 2 were measured as a function of increasing pH. Colloidal sols were prepared at 0.6% solids and titrated with 0.1M NaOH. Results are presented in graphical format in FIG. 4.

Most striking is the difference in surface charge for these particles in the acidic regime. At pH values less than 6, the deionized Composition 1 and Composition 2 exhibits a significantly lower zeta potential than the deionized Reference Composition A. As expected, deionized Reference Composition A was found to have an isoelectric point of approximately 2, while deionized Composition 1 has a zeta potential of about −30 mV at this pH and Composition 2 has a zeta potential of about −60 mV at this pH.

Example 3

Sapphire Polishing Tests

Polishing tests were performed using two different polishing pads:
SUBA™ 600: Polyurethane impregnated polyester felt pad with a compressibility of 4% and an Asker C hardness of 80.
SUBA™ 800: Polyurethane impregnated polyester felt pad with a compressibility of 4% and an Asker C hardness of 82.

Pad conditioning opens up closed or glazed cells in the polyurethane polishing pad when new or after every use. This may improve the transport of slurry to the wafer, and may provide a consistent polishing surface throughout the pad's lifetime, resulting in less wafer to wafer polishing variability. In the pad conditioning process, the conditioning ring replaces the wafer carrier on the instrument with a minimum down force applied to the pad surface. Table 2 summarizes the conditioning parameters used to condition the pads in this study.

TABLE 2

Conditioning parameters for polishing pads using the CETR CMP tester.

| Parameter | |
|---|---|
| Conditioning pad | CETR diamond abrasive embedded grid on 4 inch platen |
| Slurry | Deionized water |
| Slurry flow rate | 100 ml/min |
| Velocity | 10 mm oscillation @ 10 per minute Conditioner carrier 65 rpm; polishing pad 65 rpm |
| Conditioning pressure | 0.1 psi |
| Conditioning time | 10 minutes |

The CP-4 CMP testing instrument can accommodate 2 to 4 inch wafers and a 9 inch platen pad. During polishing, the friction force, the coefficient of friction (CoF) at the wafer pad interface and the platen temperature are continuously monitored in-situ. Similarly, a Speedfam GPAW 32 polisher, with 4 polishing heads accommodating 3 wafers each, was used to obtain polishing performance data. The process conditions used in this example are summarized in Table 3.

TABLE 3

Polishing parameters

| Parameter | |
|---|---|
| Slurry concentrations | 20% solids loading (C-plane) 40% (A and R plane) |
| Velocity | polishing pad 65 rpm |
| Polishing pressure | 7.11 psi (C plane) 9.3 psi (A and R plane) |
| Polishing time | 180 minutes |
| Number of replicate polishing runs | 2-6 |

In order to remove polishing debris from the surface of the polished sapphire wafer, the wafers were first rinsed with DI water, and then sonicated in an ethanol bath for 10 minutes, followed by sonication in a DI water bath for an additional 10 minutes.

Results of C plane wafer polishing tests on the CETR CP-4 are shown in Table 4 and results of sapphire polishing tests on the Speedfam GPAW 32 are shown in Table 5.

TABLE 4

C-plane sapphire average material removal rates (MRRs) obtained at 180 minute polish. All material removal rate values are expressed in micron/hour.

| | pH | MRR SUBA™ 600 | MRR SUBA™ 800 |
|---|---|---|---|
| Reference Composition A | 9.5-10.0 | 1.07 | 1.28 |
| Deionized Reference Composition A | 3 | 1.99 | 1.03 |

TABLE 4-continued

C-plane sapphire average material removal rates (MRRs) obtained at 180 minute polish. All material removal rate values are expressed in micron/hour.

| | pH | MRR SUBA™ 600 | MRR SUBA™ 800 |
|---|---|---|---|
| Acid Adjusted Reference Composition A | 3 | 1.55 | |
| Deionized Reference Composition A/adjusted to pH 6 with NaOH | 5.93 | 1.85 | 1.41 |
| Composition 1 | 9.7-10.0 | 0.96 | 1.09 |
| Deionized Composition 1 | 3 | 1.94 | 1.12 |
| Acid Adjusted Composition 1 | 3 | 1.4 | |
| DI Composition 1/adjusted to pH 6 with NaOH | 6.02 | | 1.84 |

TABLE 5

C-Plane Sapphire average material removal rates (MRRs) obtained at 180 minute polish on the Speedfam GPAW 32 polisher. All material removal rate values are expressed in micron/hour.

| | pH range | MRR SUBA™ 600 |
|---|---|---|
| Reference Composition A | 9.5-10.0 | 1.26 |
| Deionized Reference Composition A | 3 | 1.75 |
| Deionized Reference Composition A/adjusted to pH 6 with NaOH | 6 | 1.89 |
| Composition 1 | 9.5-10 | 1.15 |
| Deionized Composition 1 | 3.5 | 1.93 |
| Deionized Composition 1/adjusted to pH 6 with NaOH | 6 | 2.5 |
| Composition 2 | 9.5-10 | 1.75 |
| Deionized Composition 2 | 3.5 | 1.96 |
| Deionized Composition 2/adjusted to pH 6 with NaOH | 6 | 2.64 |

Figure 5:
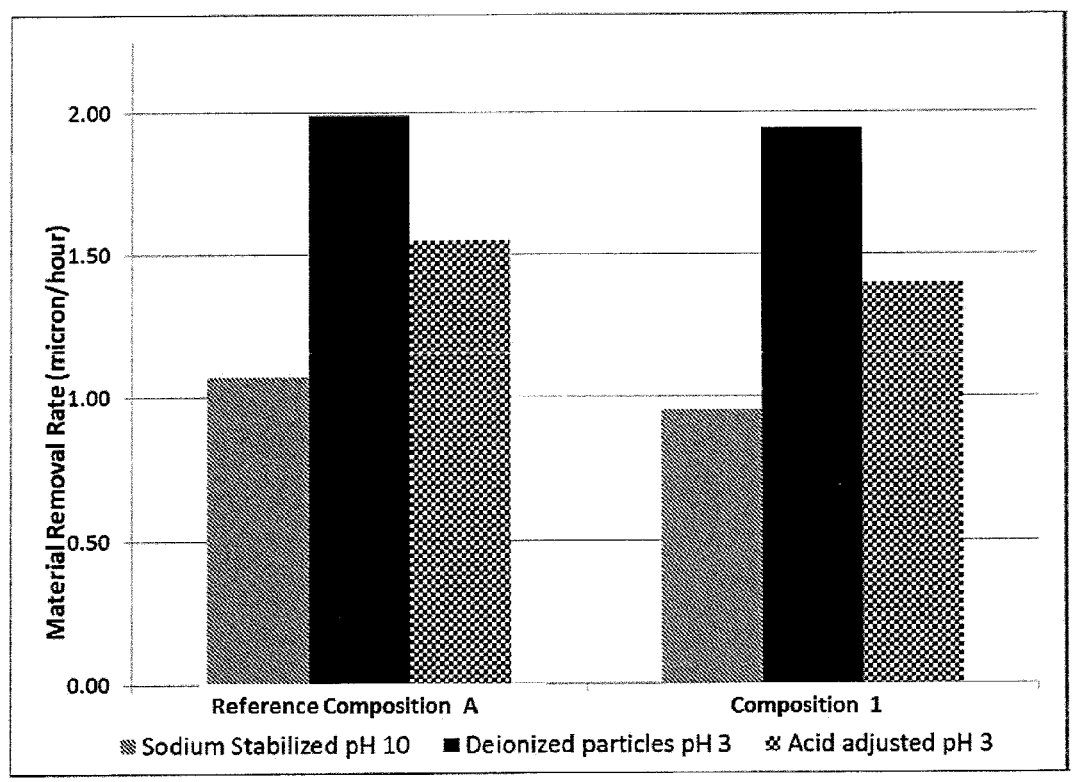
FIG. 5 is a graph of material removal rates from sapphire surfaces for colloidal silica and aluminosilicate compositions described herein, under varying conditions.

Data collected on the SUBA™ 600 CETR polishing runs is also graphically represented in FIG. 5. As shown in the figure and in Tables 4 and 5, sapphire removal rates for polishing processes using the SUBA™ 600 are dependent upon the slurry pH, with acidic slurries demonstrating higher removal rates. Deionization of the sodium stabilized particles results with a drop in the slurry pH from about 9.5 to approximately pH 3, results in approximately a doubling in the removal rate for both the aluminum doped Composition 1 particles, as well as the Reference Composition A non-doped particles.

Simply adjusting the pH of the sodium stabilized slurries with phosphoric acid to a pH of 3 does not result in the same removal rates as the deionized slurries.

Figure 6:
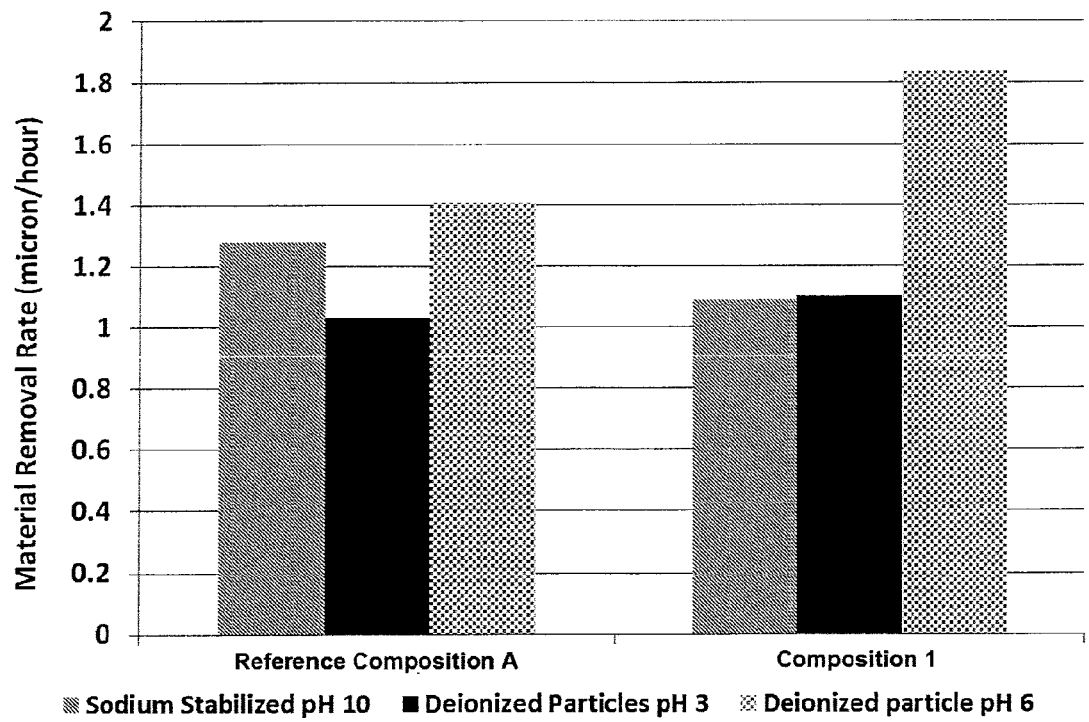
FIG. 6 is a graph of material removal rates from sapphire surfaces for colloidal silica and aluminosilicate compositions described herein, under varying conditions.
Figure 7:
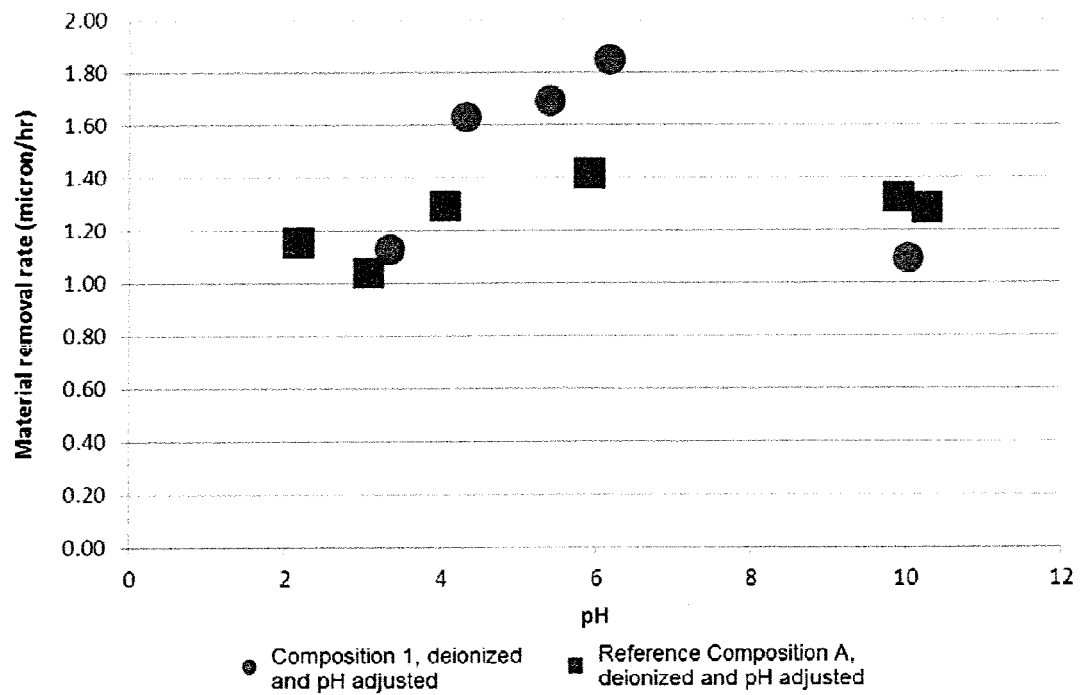
FIG. 7 shows material removal rates from c plane sapphire as a function of abrasive particle and slurry pH.

Data collected from the SUBA™ 800 polishing runs is graphically depicted in FIGS. 6 and 7, for Composition 1 and the similarly sized Reference Composition A. Similar to the SUBA™ 600 polishing conditions, optimum removal rates were observed at acidic pH conditions. With this pad, however, it was possible to generate data for deionized slurries which were pH adjusted with 0.1M NaOH across the pH range of 2 to 10.5, and for comparison purposes the MRR for the slurries at pH 6 is included in FIG. 6. At pH 6, the advantage of the aluminosilicate shell is most obvious, with an improvement of approximately 50% in removal rate over the high pH sodium stabilized particle. This jump in polishing performance is less significant with the non-aluminum doped Reference Composition A particles, which showed an improvement of approximately 10% in MRR over the high pH slurry. This improvement in removal rate is also significant for the more negatively charged particles of Composition 2, which shows improvement of approximately 51% in removal rate over the high pH sodium stabilized particle, and shows improvement of approximately 40% in removal rate over the pH 6 Reference Composition 1 slurry.

To further investigate the impact of pH on the removal rates of sapphire, a simple ladder study was conducted, polishing wafers with slurries which were pH adjusted with 0.1M NaOH across the pH range of 3 to pH 10. This data is presented in FIG. 7. From pH 2-6, both Reference Composition A and Composition 1 show a linear relationship with increasing removal rate with increasing pH, however the aluminum doped Composition 1 displays a much stronger dependence upon pH. With this pad, Composition 1 slurries which were pH adjusted to pH 6 produced the highest removal rate reported at 1.84 micron/hour.

Figure 8A:
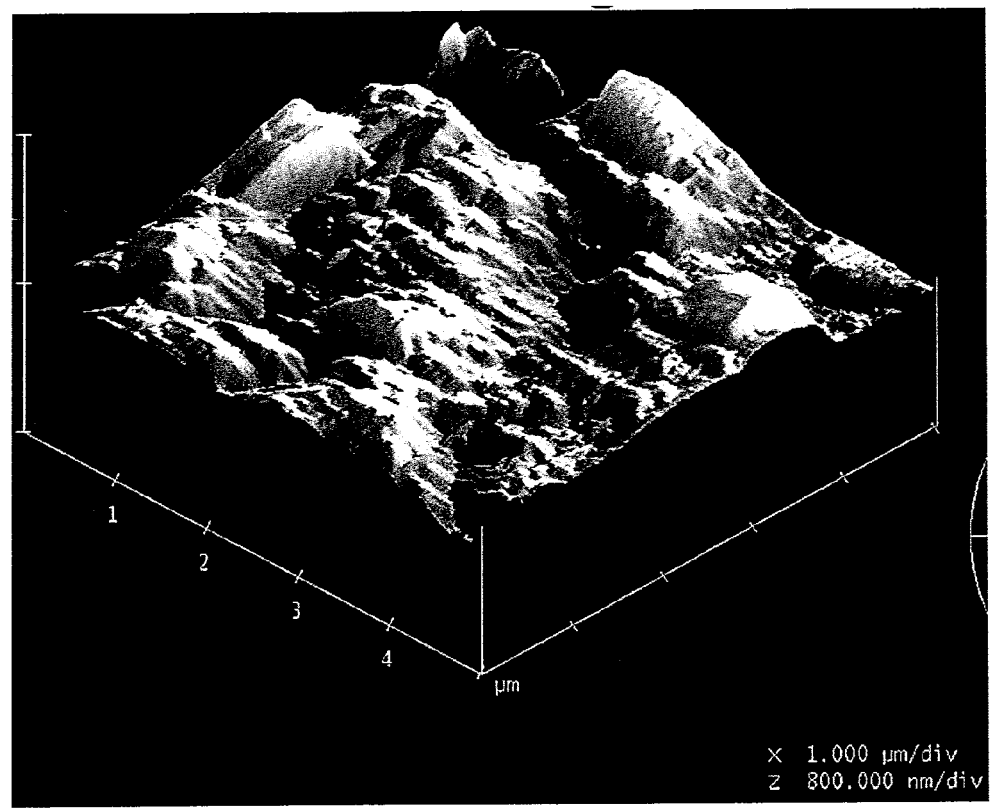
FIG. 8 shows: A) an atomic force microscopy 5 µm×5 µm×800 nm surface plot of a c-plane sapphire wafer surface before polishing; and B) a 20 µm×20 µm×2000 nm surface plot of the same wafer.
Figure 8B:
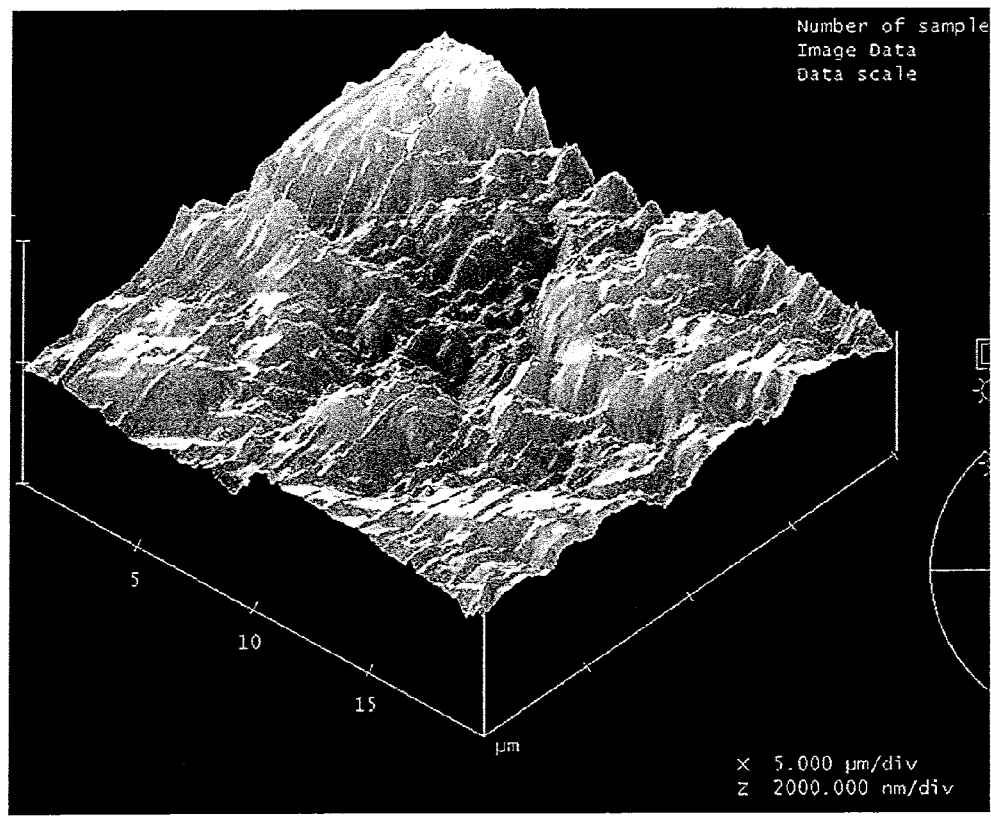

Atomic force microscopy (AFM) images of c-plane sapphire wafers prior to polishing are shown in FIGS. 8A and 8B. FIG. 8 shows a typical surface: A) 5 $\mu m^2 \times 800$ nm surface plot of c-plane wafer; RMS=150.5 nm and $R_a$=117.1 nm; B) 20 $\mu m^2 \times 2000$ nm surface plot of the same wafer wafer, RMS=204.3 nm and an $R_a$=162.6 nm. Large, sharp surface features are evident and the z-scale indicates those features are on the order of hundreds of nanometers in height. Feature height is generally correlated to the image size. This is because the smaller the area being imaged, the less likely a representative sampling of the total feature distribution will be captured. For example, with sparsely distributed features on the order of a micron in width and height, a 5 $\mu m \times 5$ $\mu m$ image may not capture the particular area containing one of those, and instead might record the highest feature as only half a micron in size. On the other hand, a 50 $\mu m$ or 75 $\mu m$ square image might capture several of the highest features. As a result, the ideal image size for roughness assessment changes as the wafer surface is smoothed. Initially, on unpolished surfaces, a 50-75 $\mu m$ image might be appropriate whereas at final polish, a 1 $\mu m$ image might be ideal.

Figure 9:
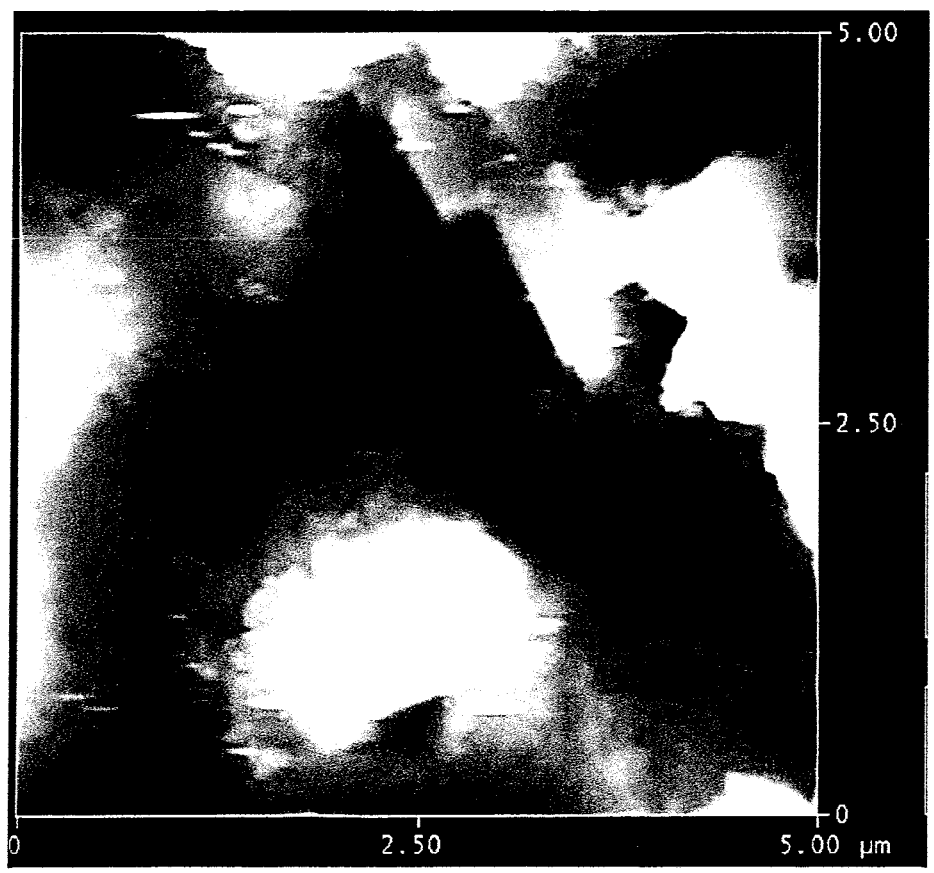
FIG. 9 shows an atomic force microscopy top view image of a c-plane sapphire wafer surface before polishing.

A top view of the same 5 $\mu m^2$ location is shown in FIG. 9. The top view indicates relative height of surface features by color shading, with the lowest areas appearing dark and the highest areas being light. The image Z-range for this unpolished surface indicates peaks as high as half a micron (from the lowest point). The roughness for the whole image is $R_a$=117 nm, considerably higher than the eventual goal of sub-nanometer roughness. Because this is the surface of the wafer after slicing (sawing) from the sapphire core, saw marks are the likely cause of the morphology seen in FIGS. 8A and 8B.

Sapphire wafers polished with various compositions under conditions listed in Table 3 were subjected to atomic force microscopy (AFM). Data are summarized in Table 6.

TABLE 6

Average AFM roughness values for 1 $\mu m^2$ areas for wafers polished for 180 minutes under conditions listed in Table 3. All roughness data reported in nanometers (nm)

| | | SUBA™ 600 | | SUBA™ 800 | |
|---|---|---|---|---|---|
| | pH | RMS | Ra | RMS | Ra |
| Reference Composition A | 9.5-10.0 | 1.106 | 0.460 | 0.545 | 0.471 |
| Deionized Reference Composition A | 3 | 0.598 | 0.42 | 0.527 | 0.312 |

TABLE 6-continued

Average AFM roughness values for 1 μm² areas for wafers polished for 180 minutes under conditions listed in Table 3. All roughness data reported in nanometers (nm)

| | | SUBA™ 600 | | SUBA™ 800 | |
|---|---|---|---|---|---|
| | pH | RMS | Ra | RMS | Ra |
| Acid Adjusted Reference Composition A | 3 | 0.58 | 0.286 | — | — |
| Deionized Reference Composition A/adjusted to pH 6 with NaOH | 5.93 | — | — | 0.401 | 0.353 |
| Composition 1 | 9.7 | 0.461 | 0.226 | 0.438 | 0.196 |
| Deionized Composition 1 | 3 | 0.397 | 0.271 | 0.397 | 0.271 |
| Acid Adjusted Composition 1 | 3 | 0.826 | 0.576 | 0.696 | 0.415 |
| DI Composition 1/adjusted to pH 6 with NaOH | 6.02 | — | — | 0.192 | 0.185 |

Figure 10:
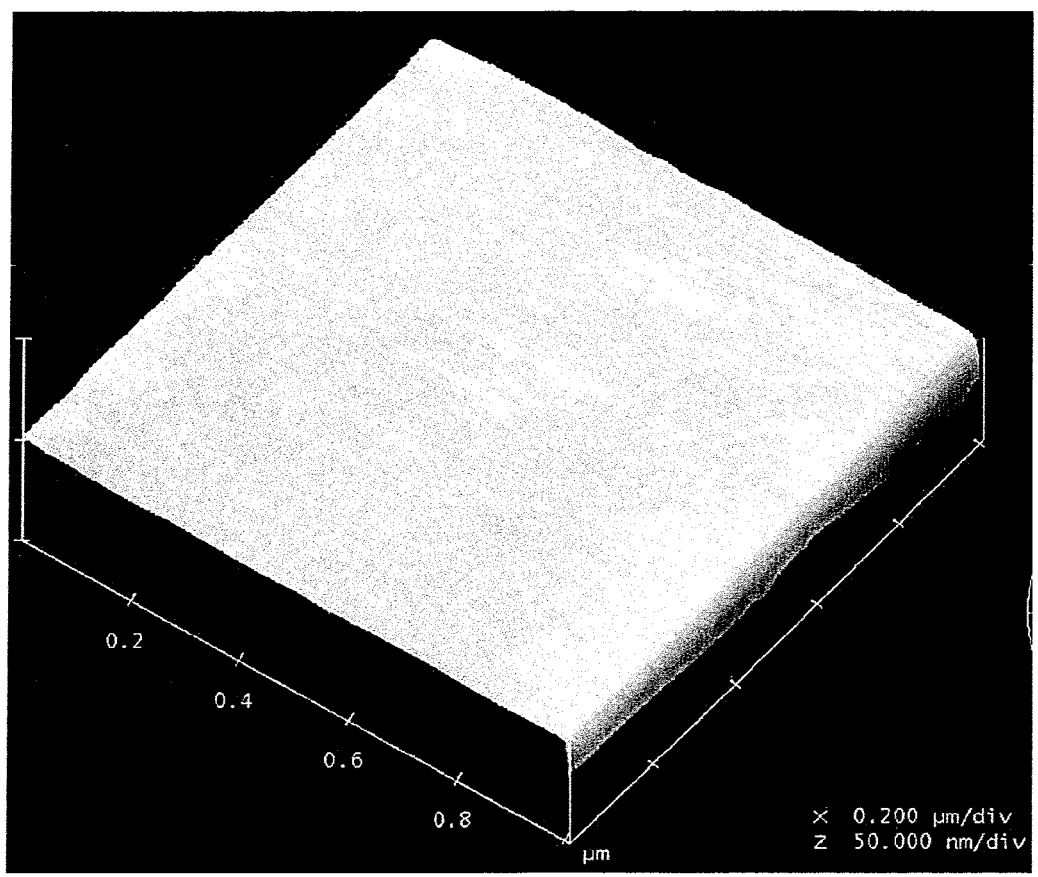
FIG. 10 shows an atomic force microscopy 1 µm×1 µm×50 nm surface plot of a c-plane wafer after polishing with deionized Composition 1, pH 3.
Figure 11:
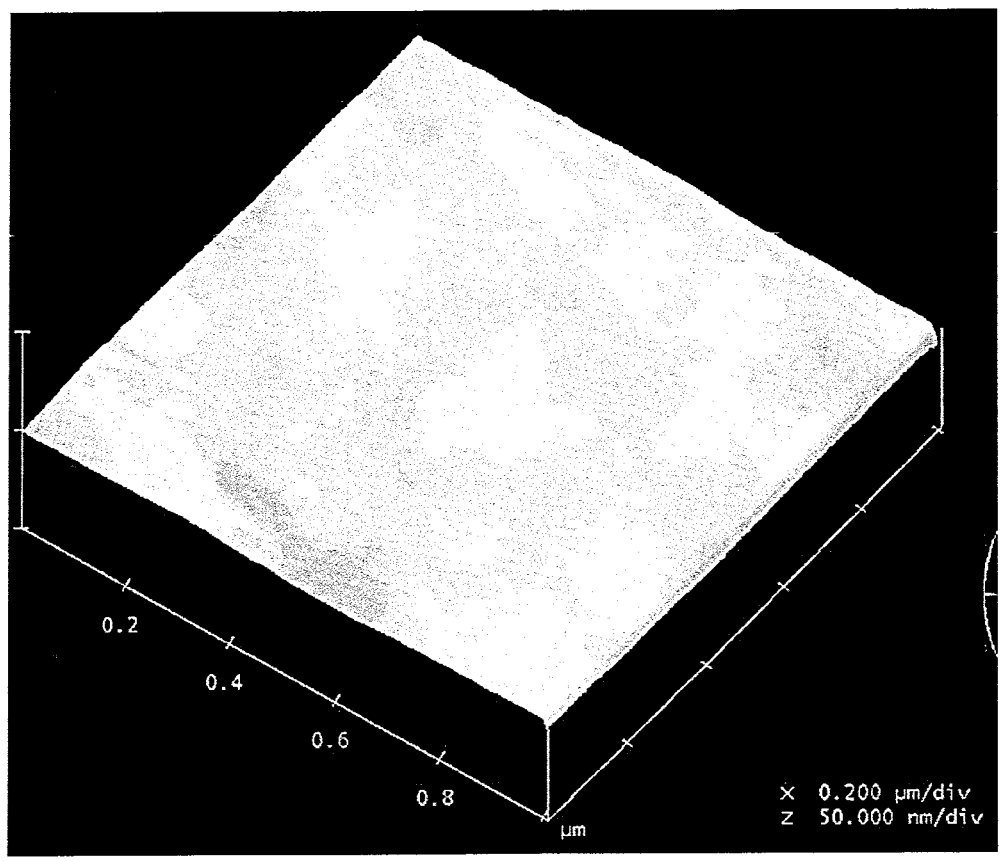
FIG. 11 shows an atomic force microscopy 1 µm×1 µm×50 nm surface plot of a c-plane wafer after polishing with deionized Reference Composition A, pH 3.
Figure 12:
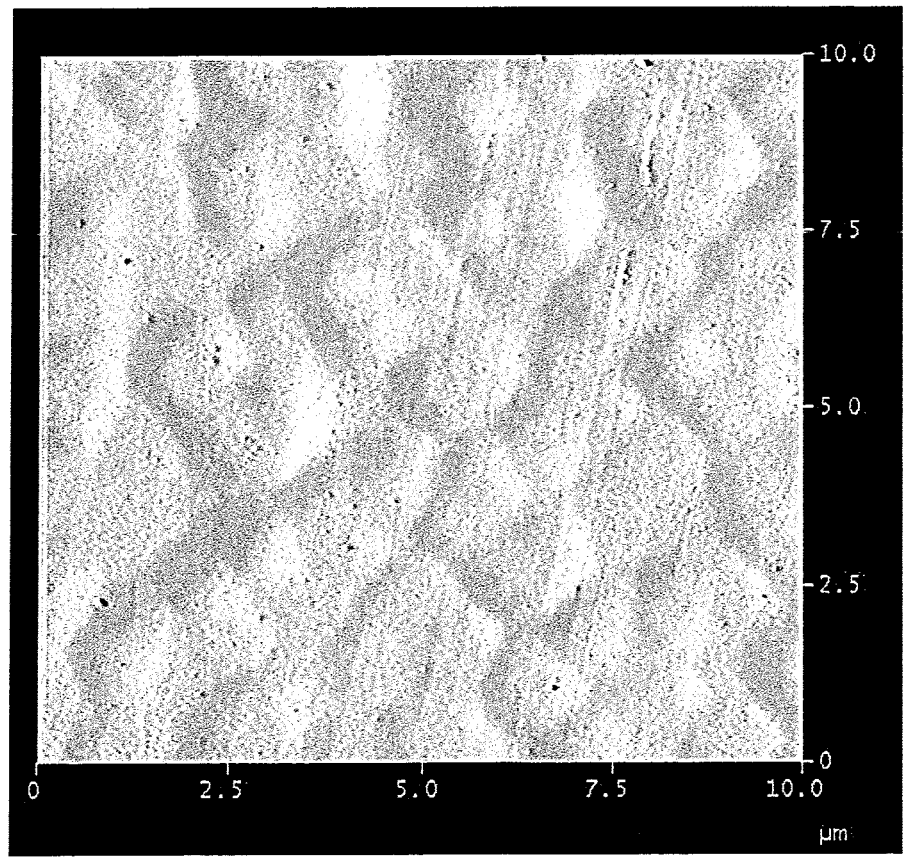
FIG. 12 shows an atomic force microscopy top view image of the same wafer as that shown in FIG. 11.
Figure 13:
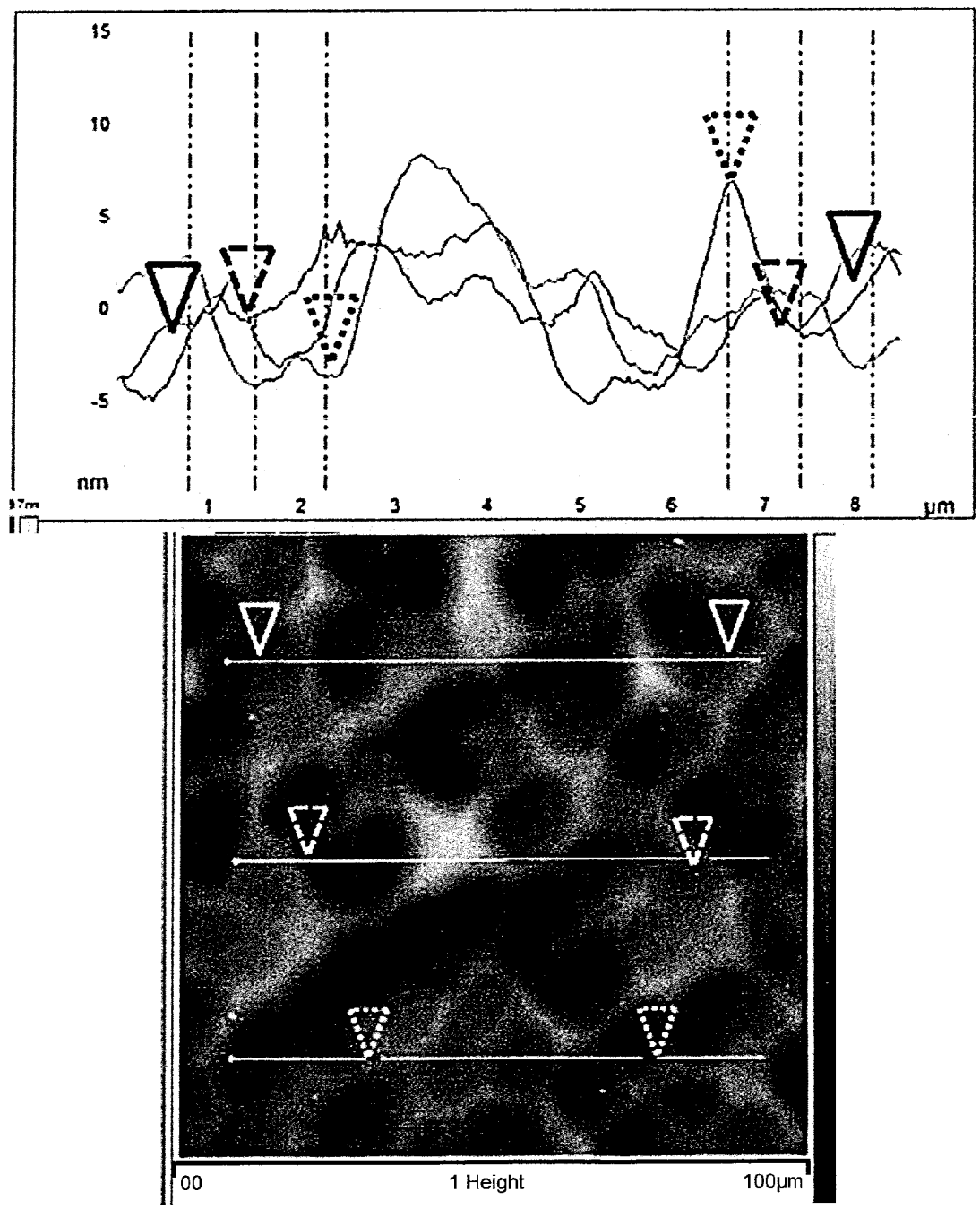
FIG. 13 shows an atomic force microscopy profile section from the same wafer shown in FIGS. 11 and 12, illustrating variability across the surface.

Polishing for a period of 3 hours on the SUBA™ 600 pad at a downforce of 7.11 psi at pH 3 can produce a surface such as that seen in FIGS. 10-12. When using the deionized Composition 1 at pH 3, the surface of the wafer is relatively smooth, meeting the target of submicron AFM RMS roughness. As seen in FIG. 10, a roughness of 0.397 nm (Ra=0.271 nm) was observed for this slurry. For Reference Composition A, the surface of the wafer polished at pH 3 has unacceptable surface finish, most clearly seen in FIG. 12 and analyzed in FIG. 13. Under these acidic matrix conditions, the sapphire substrate displays extreme pitting across the surface, so while the AFM RMS is measured at about 0.6 nm, divots are measured on the micron scale, as pointed out in FIG. 13. This phenomenon may be due to the extreme acidic pH conditions, and to further investigate, the wafers polished at pH values up to pH 6 were evaluated.

Figure 14:
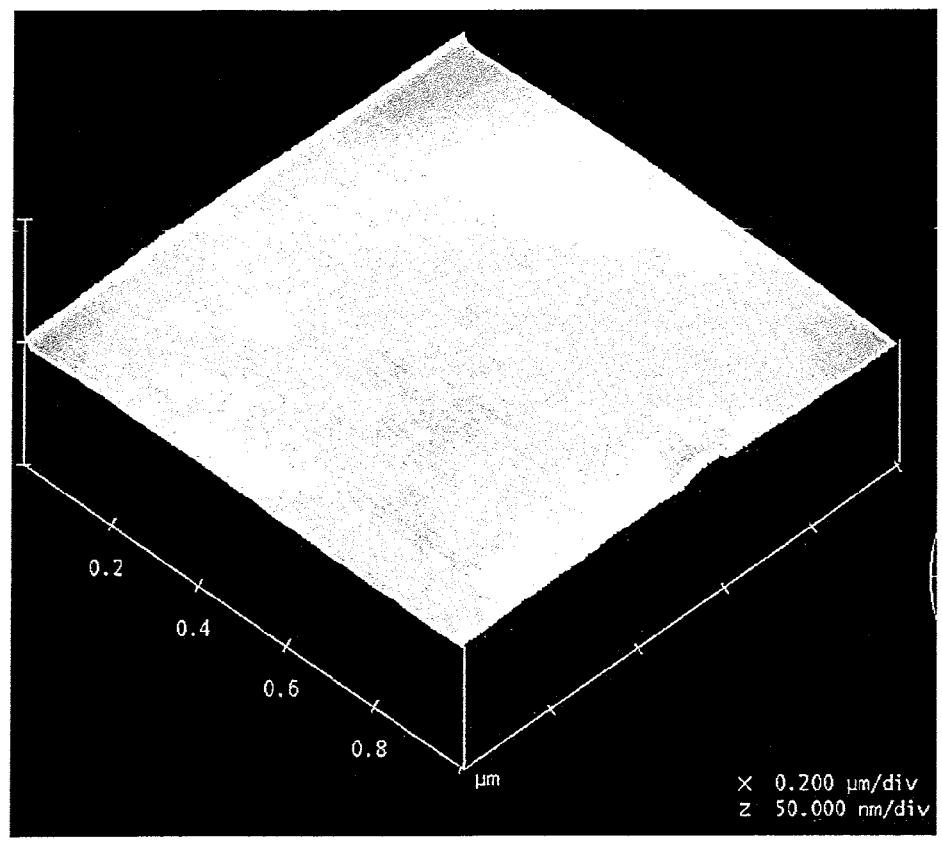
FIG. 14 shows an atomic force microscopy 1 µm×1 µm×50 nm surface plot of a c-plane wafer after polishing with Reference Composition A, pH 6.
Figure 15:
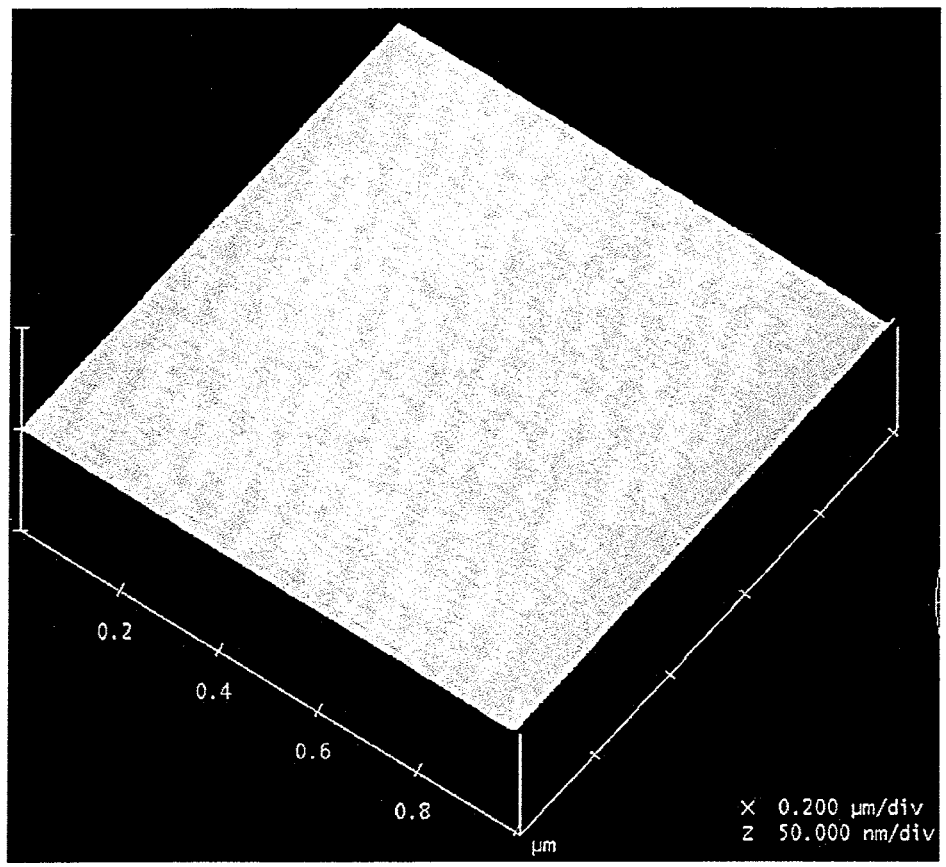
FIG. 15 shows an atomic force microscopy 1 µm×1 µm×50 nm surface plot of a c-plane wafer after polishing with deionized Composition 1, pH 6.
Figure 16:
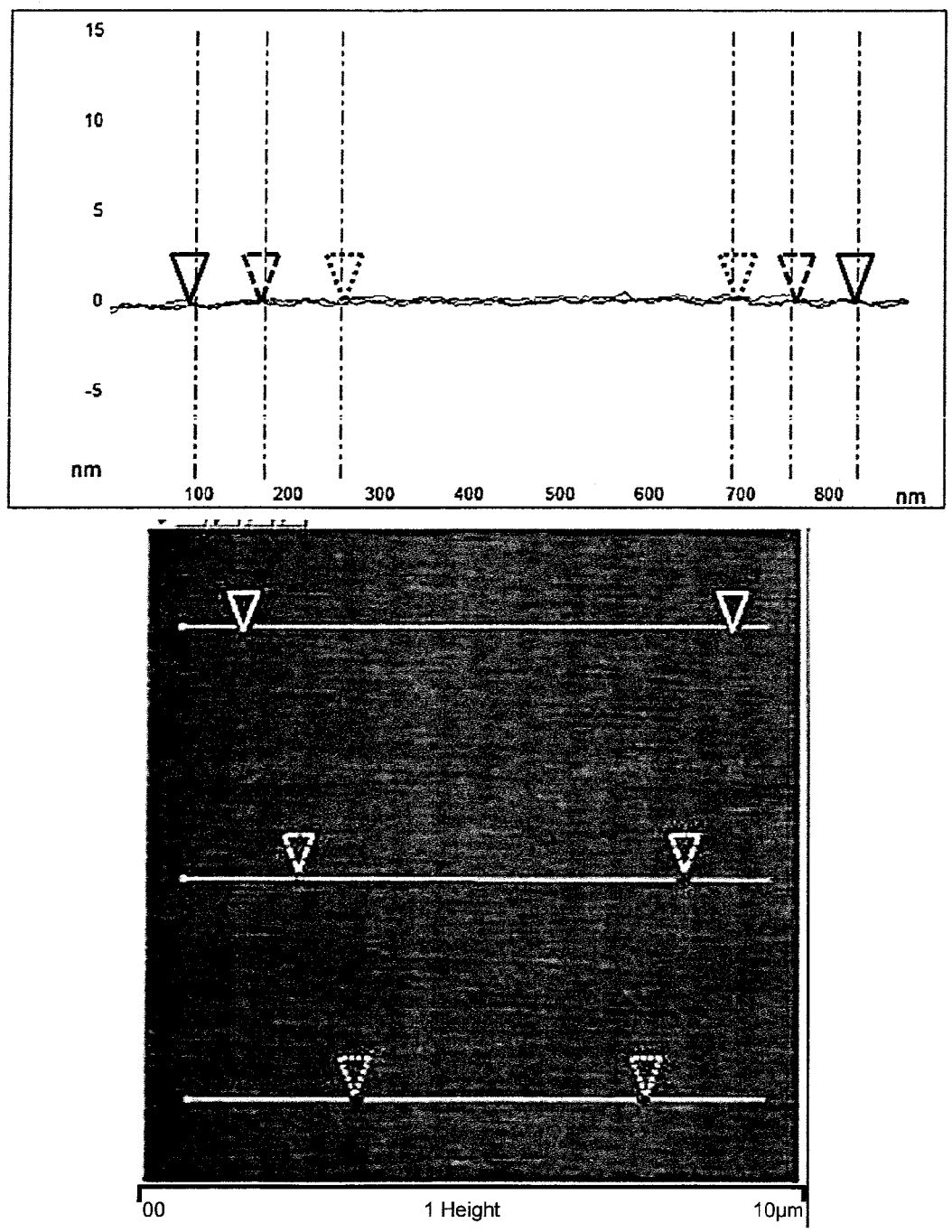
FIG. 16 shows an atomic force microscopy profile section from the same wafer shown in FIG. 15, illustrating variability across the surface.

The 180 minute polish runs at pH 6 were able to more consistently meet the targets of the sub-nanometer surface roughness. FIGS. 14 and 15 shows wafer surfaces after polishing at pH 6 with deionized Reference Composition A and deionized Composition 1, respectively, where each had been adjusted to pH 6 with NaOH. These demonstrate that sub-nanometer average roughness was achieved, with best performance obtained for deionized Composition 1 with an RMS values seen of 0.190 nm and a $R_a$ of 0.109 nm, as shown in FIG. 15 and analyzed in cross section in FIG. 16. These abrasives also achieved the highest removal rates as reported in Section D above, with MRR values of approximately 2 micron per hour. It is important to note that at this pH, none of the wafers displayed sections with the pitting and increased surface roughness as observed at pH 3.

R-plane sapphire wafers may be polished with similar trends observed. For example, R-plane wafers polished for 3 hours using Reference Composition A at 40% solids at pH 6 under 9.3 psi pressure on a SUBA 600 pad results in a material removal rate 3.36 micron/minute, achieving an RMS of 2.5 Angstroms. R-plane wafers polished for 3 hours using Composition 1 at 40% solids at pH 6 under the same process conditions results in a material removal rate of 5.68 micron/minute, achieving an RMS of 2.5 Angstroms. This represents an increase in removal rate of 20% above the removal rate for R-plane wafers polished under identical process conditions with the slurry at pH 9.5.

A-plane sapphire wafers may be polished with similar trends observed. For example, A-plane wafers polished for 3 hours using Reference Composition A at 40% solids at pH 6 under 9.3 psi pressure on a SUBA 600 pad results in a material removal rate 1.9 micron/minute. A-plane wafers polished for 3 hours using Composition 1 at 40% solids at pH 6 under the same process conditions results in a material removal rate of 4.25 micron/minute. This represents an increase in removal rate of 22% above the removal rate for A-plane wafers polished under identical process conditions with the slurry at pH 9.5.

What is claimed is:

1. A method of polishing a sapphire surface, comprising: abrading a sapphire surface with a rotating polishing pad and a polishing composition, wherein the polishing composition consists of water and about 40 weight % of a colloidal aluminosilicate, wherein the composition has a pH of 6.0, wherein the ratio of the standard deviation of the particle size of the colloidal aluminosilicate (σ), to the mean particle size of the colloidal aluminosilicate (r), is less than about 0.3, wherein a mean colloidal particle size of the colloidal aluminosilicate is about 100 nm, as measured by dynamic light scattering, wherein the sapphire surface is a sapphire R-plane surface or a sapphire A-plane surface, and wherein the polishing composition comprises a zeta potential between about −30 mV and about −60 mV.

2. The method of claim 1, wherein the colloidal aluminosilicate comprises about 0.01 wt % to about 2.0 wt % aluminum (Al) based on silica.

3. The method of claim 1, wherein the polishing pad is applied to the sapphire surface with a downforce of about 5 psi to about 25 psi.

4. The method of claim 1, wherein the polishing pad is rotated at a rate of about 40 rpm to about 120 rpm.

5. The method of claim 1, wherein the polishing pad comprises a polyurethane impregnated polyester material.

6. The method of claim 1, wherein the polishing pad has a compressibility of about 1% to about 40%.

7. The method of claim 1, wherein the polishing pad has a Shore D hardness of about 50 to about 60.

8. A method of polishing a sapphire surface, comprising: abrading a sapphire surface with a rotating polishing pad and a polishing composition, wherein the polishing composition consists of water and about 20 weight % of a colloidal aluminosilicate, wherein the composition has a pH of 6.0, wherein the ratio of the standard deviation of the particle size of the colloidal aluminosilicate (σ), to the mean particle size of the colloidal aluminosilicate (r), is less than about 0.3, wherein a mean colloidal particle size of the colloidal aluminosilicate is about 100 nm, as measured by dynamic light scattering, wherein the sapphire surface is a sapphire C-plane surface, and wherein the polishing composition comprises a zeta potential between about −30 mV and about −60 mV.

* * * * *